US011255891B1

(12) United States Patent
Crowley et al.

(10) Patent No.: US 11,255,891 B1
(45) Date of Patent: Feb. 22, 2022

(54) OVER-THE-AIR TESTING INTERFACE FOR PHASE ARRAY ANTENNAS

(71) Applicant: NATIONAL INSTRUMENTS CORPORATION, Austin, TX (US)

(72) Inventors: David M. Crowley, Cedar Park, TX (US); Gerardo Orozco Valdes, Austin, TX (US); Chen Chang, Fremont, CA (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 17/064,814

(22) Filed: Oct. 7, 2020

Related U.S. Application Data

(60) Provisional application No. 63/078,769, filed on Sep. 15, 2020.

(51) Int. Cl.
*G01R 31/302* (2006.01)
*G01R 29/10* (2006.01)
*G01R 29/08* (2006.01)

(52) U.S. Cl.
CPC ....... *G01R 29/105* (2013.01); *G01R 29/0871* (2013.01)

(58) Field of Classification Search
CPC .. G01R 29/10; G01R 29/105; G01R 29/0871; G01R 31/2822; G01R 31/2856; G01R 31/2884; G01R 31/2889; G01R 31/2834; G01R 31/3025; G01R 31/31905; G01R 1/045; G01R 1/048; G01R 1/18; G01R 1/24
USPC ...................................................... 324/750.27
See application file for complete search history.

(56) References Cited

U.S. PATENT DOCUMENTS

| | | | |
|---|---|---|---|
| 10,725,080 B2 | 7/2020 | Orozco Valdes et al. | |
| 10,790,915 B2 | 9/2020 | DaSilva et al. | |
| 2009/0153158 A1* | 6/2009 | Dunn ................ | G01R 31/2822 324/762.01 |
| 2010/0283476 A1* | 11/2010 | Shen ...................... | G01R 1/045 324/537 |
| 2019/0004102 A1* | 1/2019 | Gienger ............... | G01R 29/105 |
| 2019/0349096 A1* | 11/2019 | Wadell ................ | G01R 31/303 |
| 2019/0353698 A1 | 11/2019 | DaSilva et al. | |
| 2019/0372687 A1* | 12/2019 | Nagata .............. | G01R 29/0878 |
| 2020/0096554 A1 | 3/2020 | Orozco Valdes et al. | |

\* cited by examiner

*Primary Examiner* — Thang X Le
(74) *Attorney, Agent, or Firm* — Kowert, Hood, Munyon, Rankin and Goetzel P.C.; Jeffrey C. Hood

(57) ABSTRACT

Various embodiments are presented of a system including an alignment fixture for testing (e.g., rapidly and cheaply) phased array antennas and other devices configured for radio frequency (RF) transmission and/or reception. A device to be tested (e.g., the device under test (DUT)) may be positioned in a testing position by the alignment fixture. The alignment fixture may provide a configurable level of friction to retain the DUT in the testing position. The alignment fixture may provide isolation from electromagnetic interference for the DUT while in the testing position.

20 Claims, 24 Drawing Sheets configured with program
instructions according to
embodiments of the invention

82
Computer
System

256-Element Array Chip

OVER-THE-AIR TESTING INTERFACE FOR PHASE ARRAY ANTENNAS

PRIORITY CLAIM

This application claims priority to U.S. provisional patent application Ser. No. 63/078,769, entitled "Over-The-Air Testing Interface for Phase Array Antennas," filed Sep. 15, 2020, which is hereby incorporated by reference in its entirety as though fully and completely set forth herein.

FIELD OF THE INVENTION

The present invention relates to the field of semiconductor testing, and more specifically, to testing of phase array antennas.

DESCRIPTION OF THE RELATED ART

Millimeter wave (mmW) technology is rapidly growing in importance, e.g., as $5^{th}$ generation (5G) wireless technology is becoming more widespread. Current methods for testing integrated circuits with integrated antennas for transmitting and/or receiving mmW signals may be slow and/or expensive.

The scalability of 5G may depend on reducing cost in various areas. One particular new item in 5G mmWave is that the conductive test may not be achieved as there may be no probes to the device. However, Over The Air (OTA) testing may be possible. 5G devices may have multiple phase arrays and each phase array may consist of multiple antennas (e.g., for beamforming, multiple-in-multiple-out (MIMO), and/or massive MIMO) to produce a beam pattern with a large gain and overcome pathloss issues at mmWave.

To efficiently test such devices (e.g., phase array antennas) in high volume production, each device needs to be validated independently to ensure quality. To scale this process, many devices devices will need to be tested within a window of time making manufacturing test time one of the key elements to achieve for these devices.

Functional testing and parametric testing may be difficult to integrate with existing automatic testing equipment (ATE) handlers. OTA chambers may be difficult to incorporate into production testing due to scalability constraints.

Some test methods may only test individual elements of these phase arrays and therefore they focus on functionality of each individual element and not all of antennas (e.g., and thus may not test the beamforming capability of the array).

Further, some current methods may not correlate well with the accepted 3GPP Direct Far Field methods. Moreover, some measurements may be impacted by the measurement antenna adding extra uncertainty to the results. It may be difficult or impossible to do parametric measurements on an entire phase array. Parametric tests may test individual elements functionality, but not the module as a whole.

Improvements in the field are desired.

SUMMARY OF THE INVENTION

Various embodiments are presented below of a system and method for testing (e.g., rapidly and cheaply) devices with phased array antennas, e.g., such as integrated circuits (IC) with integrated antennas configured for millimeter wave (mmW) transmission and/or reception. A level of friction may be determined for a specific type of device under test (DUT)). An alignment fixture may be configured to provide the desired level of friction. The alignment fixture may be modular, e.g., so that portions of the alignment fixture can be exchanged to accommodate particular types of DUT(s). For example, portions may be exchanged to accommodate different size or shape of DUTs as well as different desired levels of friction. The alignment fixture may be sufficiently rigid to withstand a large number of testing cycles. The alignment fixture may incorporate space for additional equipment. The alignment fixture may determine if the DUT is positioned correctly relative to the alignment fixture.

The alignment fixture may position the DUT(s) in a testing position, e.g., relative to an anechoic chamber. While in the testing position, the alignment fixture may isolate the DUT(s) from electromagnetic interference and may provide the desired level of friction. The DUT(s) capabilities to transmit and/or receive beamformed signals may be tested.

BRIEF DESCRIPTION OF THE DRAWINGS

A better understanding of the present invention can be obtained when the following detailed description of the preferred embodiment is considered in conjunction with the following drawings, in which.

Figure 1:
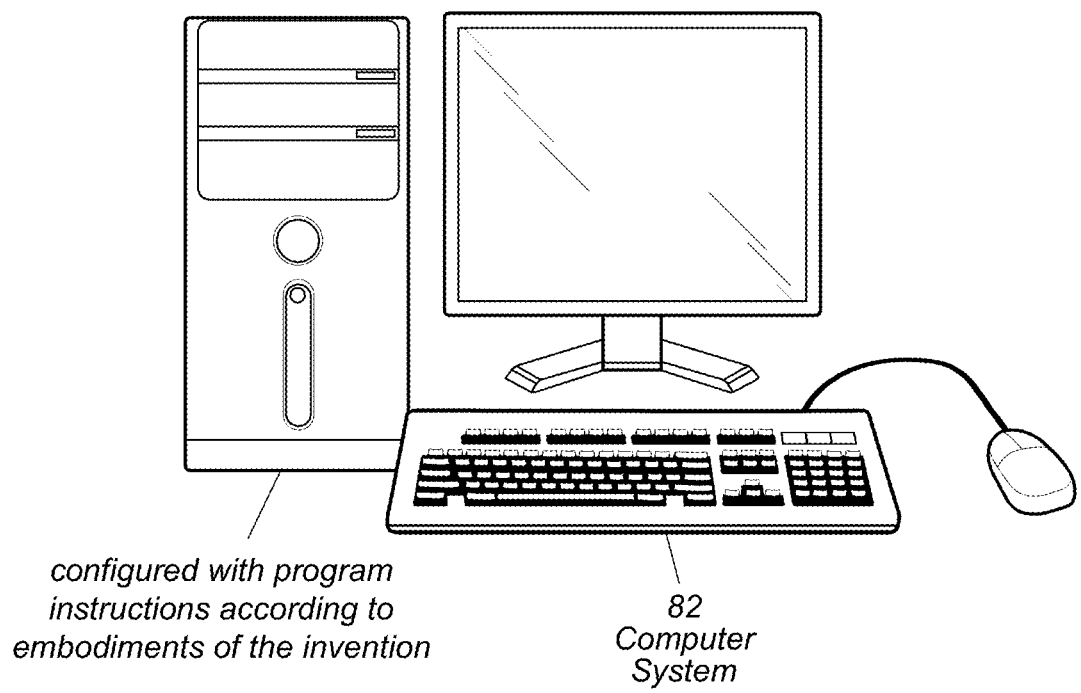
FIG. 1 illustrates a computer system configured to perform testing of an integrated circuit, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic."

Processing Element—refers to various elements or combinations of elements that are capable of performing a function in a device, such as a user equipment or a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually," wherein the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system)

analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism," where the tasks are performed in an interleaved manner, e.g., by time multiplexing of execution threads.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within 0.1% of the target value, within 0.2% of the target value, within 0.5% of the target value, within 1%, 2%, 5%, or 10% of the target value, and so forth, as required by the particular application of the present techniques.

FIG. 1A—Computer System

FIG. 1A illustrates a computer system 82 configured to implement embodiments of the techniques disclosed herein. Embodiments of a method for (e.g., for production testing of integrated circuits) are described below. Note that various embodiments of the techniques disclosed herein may be implemented in a variety of different ways. For example, in some embodiments, some or all of the techniques may be implemented with textual or graphical programs that may be deployed to, or used to configure, any of various hardware devices.

However, while some embodiments are described in terms of one or more programs, e.g., graphical programs, executing on a computer, e.g., computer system 82, these embodiments are exemplary only, and are not intended to limit the techniques to any particular implementation or platform. Thus, for example, in some embodiments, the techniques may be implemented on or by a functional unit (also referred to herein as a processing element), which may include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

As shown in FIG. 1, the computer system 82 may include a display device configured to display a graphical program as the graphical program is created and/or executed. The display device may also be configured to display a graphical user interface or front panel of the graphical program during execution of the graphical program. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more programs, such as graphical programs, that are executable to perform the methods described herein. The memory medium may also store operating system software, as well as other software for operation of the computer system. Various embodiments further include receiving or storing instructions and/or data implemented in accordance with the foregoing description upon a carrier medium.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
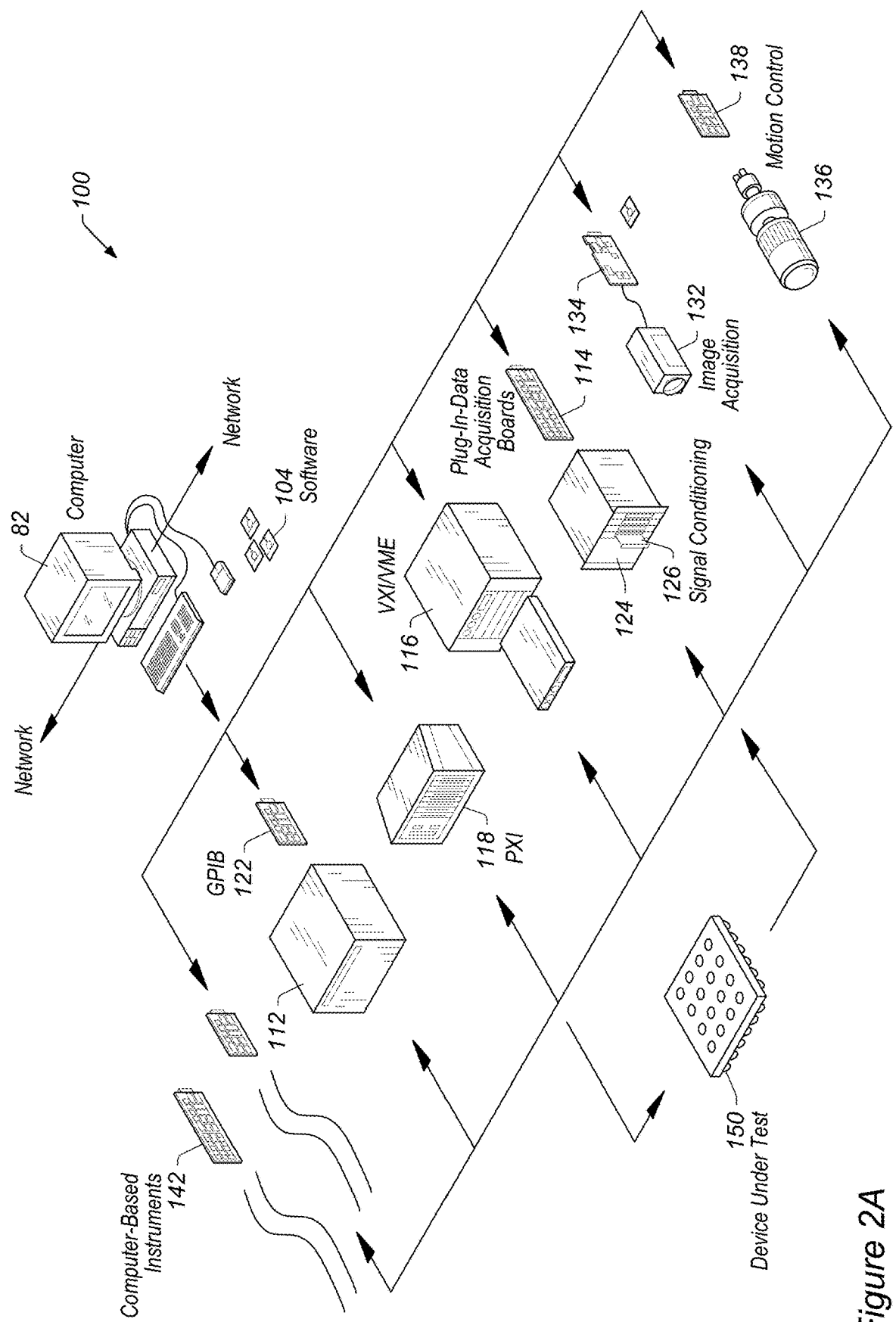
FIG. 2A illustrates an instrumentation control system according to some embodiments.

FIG. 2A illustrates an exemplary instrumentation control system 100 which may implement embodiments described herein. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150, e.g., via execution of software 104.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the device under test (DUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
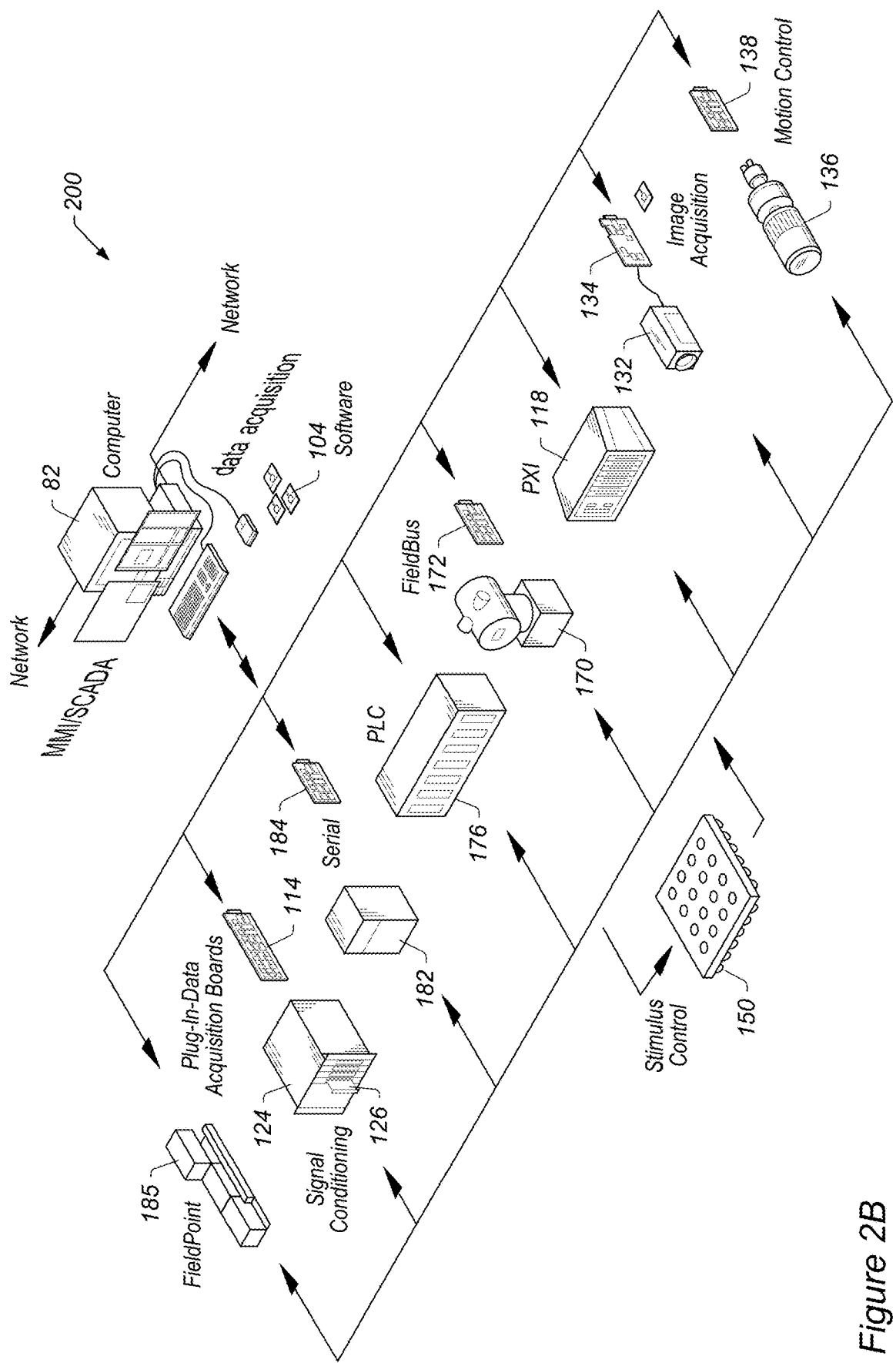
FIG. 2B illustrates an industrial automation system according to some embodiments.

FIG. 2B illustrates an exemplary industrial automation system 200 which may implement embodiments described herein. The industrial automation system 200 is similar to the instrumentation or test and measurement system 100 shown in FIG. 2A. Elements which are similar or identical to elements in FIG. 2A have the same reference numerals for convenience. The system 200 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as HMI (Human Machine Interface), SCADA (Supervisory Control and Data Acquisition), portable or distributed data acquisition, process control, advanced analysis, or other control, among others, e.g., via execution of software 104.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 270 and associated fieldbus interface card 172, a PLC (Programmable Logic Controller) 176, a serial instrument 282 and associated serial interface card 184, or a distributed data acquisition system, such as Fieldpoint system 185, available from National Instruments Corporation, among other types of devices.

In the embodiments of FIGS. 2A and 2B, above, one or more of the various devices may couple to each other over a network, such as the Internet. In one embodiment, the user operates to select a target device from a plurality of possible target devices for programming or configuration. Thus the user may create a program on a computer and use (execute) the program on that computer or deploy the program to a target device (for remote execution on the target device) that is remotely located from the computer and coupled to the computer through a network.

Software programs that perform data acquisition, analysis and/or presentation, e.g., for measurement, instrumentation control, industrial automation, modeling, or simulation, such as in the applications shown in FIGS. 2A and 2B, may be referred to as virtual instruments.

Figure 3:
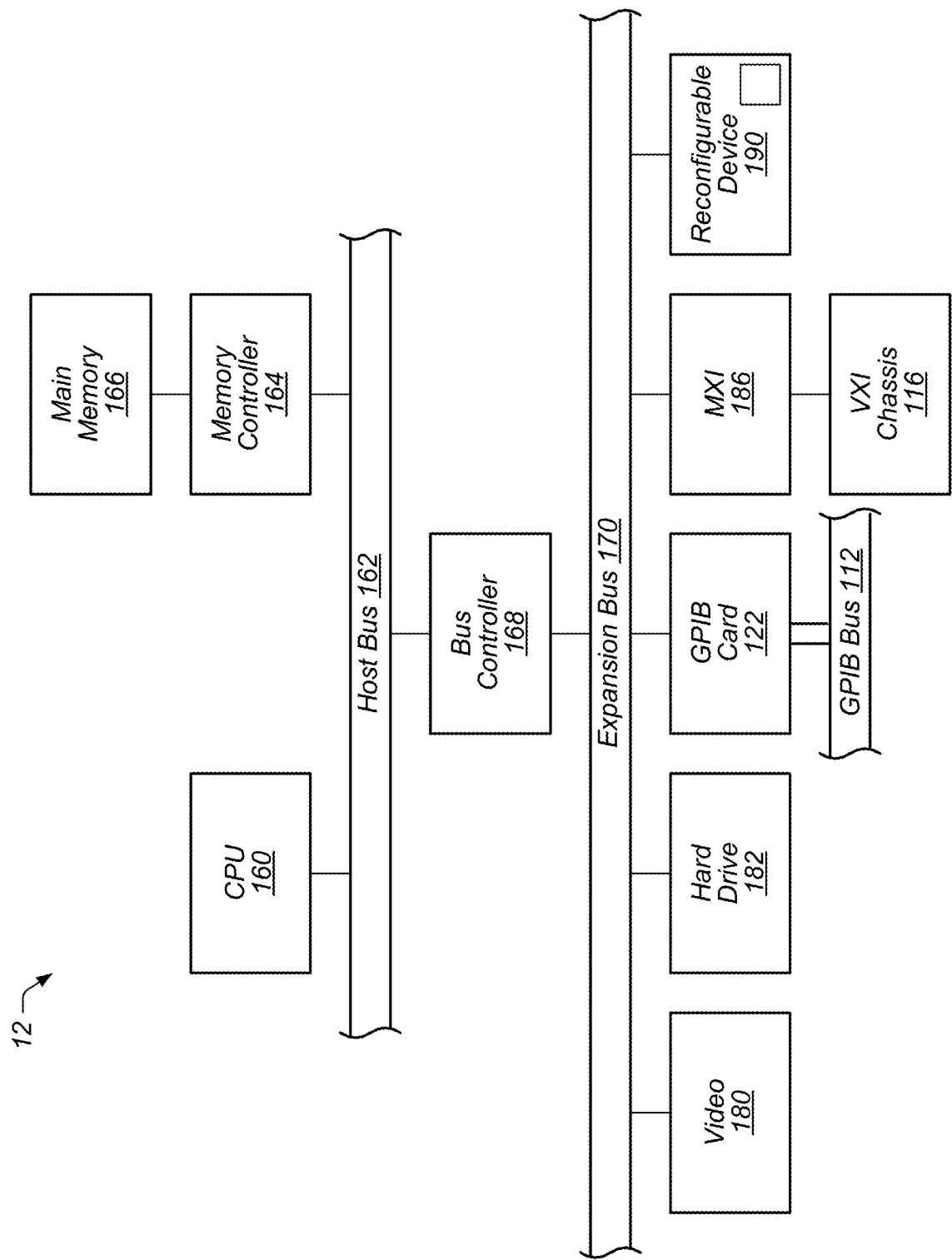
FIG. 3 is an exemplary block diagram of the computer systems of FIGS. 1, 2A, and 2B, according to some embodiments.

FIG. 3—Computer System Block Diagram

Figure 4:
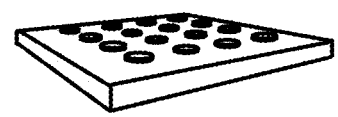
FIGS. 4-9 illustrate exemplary integrated circuits, according to some embodiments.
Figure 4:
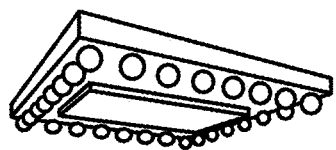

FIG. 3 is a block diagram 12 representing one embodiment of the computer system 82 illustrated in FIG. 1, 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including any type of processor (or multiple processors), as well as other features. A memory medium, typically comprising RAM and referred to as main memory, 166 is coupled to the host bus 162 by means of memory controller 164. The main memory 166 may store a program (e.g., a graphical program) configured to implement embodiments of the present techniques. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above.

The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. The computer system may be configured to deploy a program to the device 190 for execution of the program on the device 190. The deployed program may take the form of graphical program instructions or data structures that directly represents the graphical program. Alternatively, the deployed program may take the form of text code (e.g., C code) generated from the program. As another example, the deployed program may take the form of compiled code generated from either the program or from text code that in turn was generated from the program.

FIGS. 4-9—Integrated Circuit (IC) with Antennas

Integrated circuits (IC) with integrated antennas are increasingly common. Such ICs are included in many devices and may be configured to perform various functions including wireless communication (e.g., including transmission and/or reception) and radar. In particular, 5G wireless communication standards (or other standards) may provide for the use of millimeter wave (mmW) band wireless signals and beamforming (e.g., directional transmission/reception). ICs or application specific ICs (ASICs) may be an important element of many wireless devices configured to communicate using such standards. For example, an IC with an integrated array of antennas (e.g., a phased array) may be a common means of including such 5G wireless capabilities. Further, some ICs may include multiple arrays of antennas.

FIG. 4 illustrates a phased array of antennas which may be incorporated into an IC such as a complementary metal-oxide-semiconductor (CMOS) Monolithic Microwave Integrated Circuit (MMIC). As illustrated the IC may be approximately 1 cm by 1 cm, among various possibilities.

Figure 5:
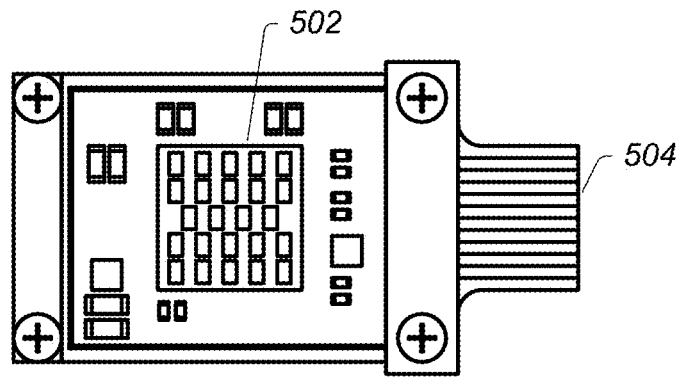

FIG. 5 illustrates an exemplary IC, including an integrated antenna array (502). Such an IC may be approximately 2.5 cm wide, among various possibilities. The IC may include wired and/or wireless connections (504) for data, control, and power.

Figure 6:
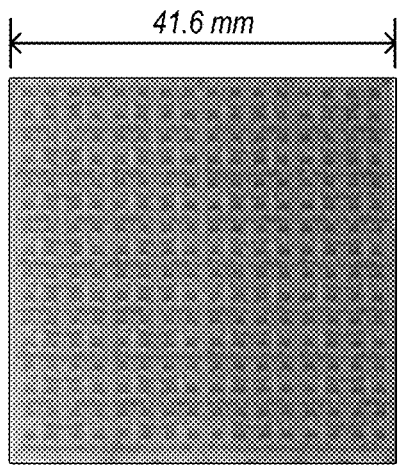

FIG. 6 illustrates an exemplary array of 256 antennas on a chip. The array may be approximately 4 cm wide, among various possibilities. It should be noted that other numbers or configurations of antennas are possible, as well as other sizes of chips. Further, the antennas may be on-chip, on-package, or even located on a separate physical structure, according to some embodiments.

Figure 7:
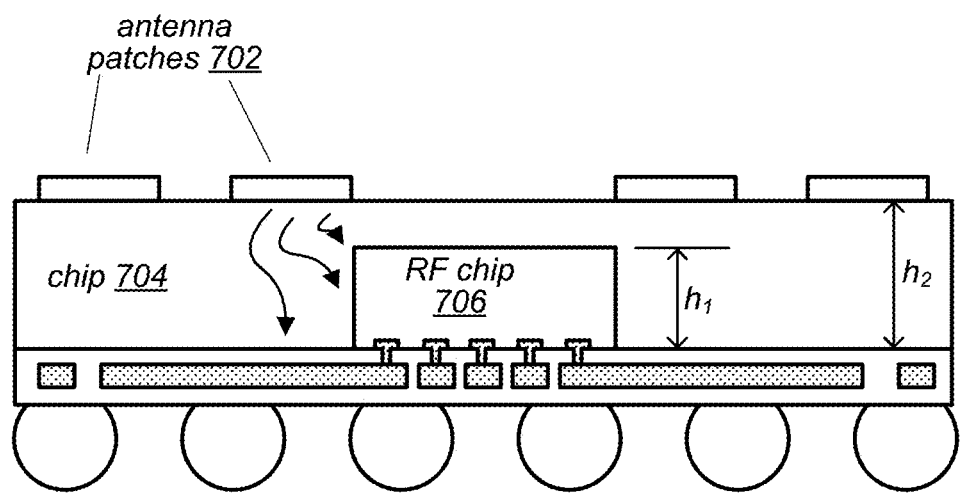

FIG. 7 illustrates an exemplary IC. As shown, the IC includes multiple (e.g., any desired number) of antenna patches (702) mounted to a chip (704) (e.g., a printed circuit board (PCB), glass wafer, silicon wafer, etc.). The antenna patches may transmit signals to and from an integrated RF chip (or chips) (706). Note that the RF chip (706) may be included in the chip (704), but may not reach the full thickness of the chip (704). In the illustrated example, the RF chip (706) reaches height h1, which is less than the full height of the chip (704), h2. The RF chip (706) may be connected to other elements of the IC, e.g., via wired connections.

Figure 8:
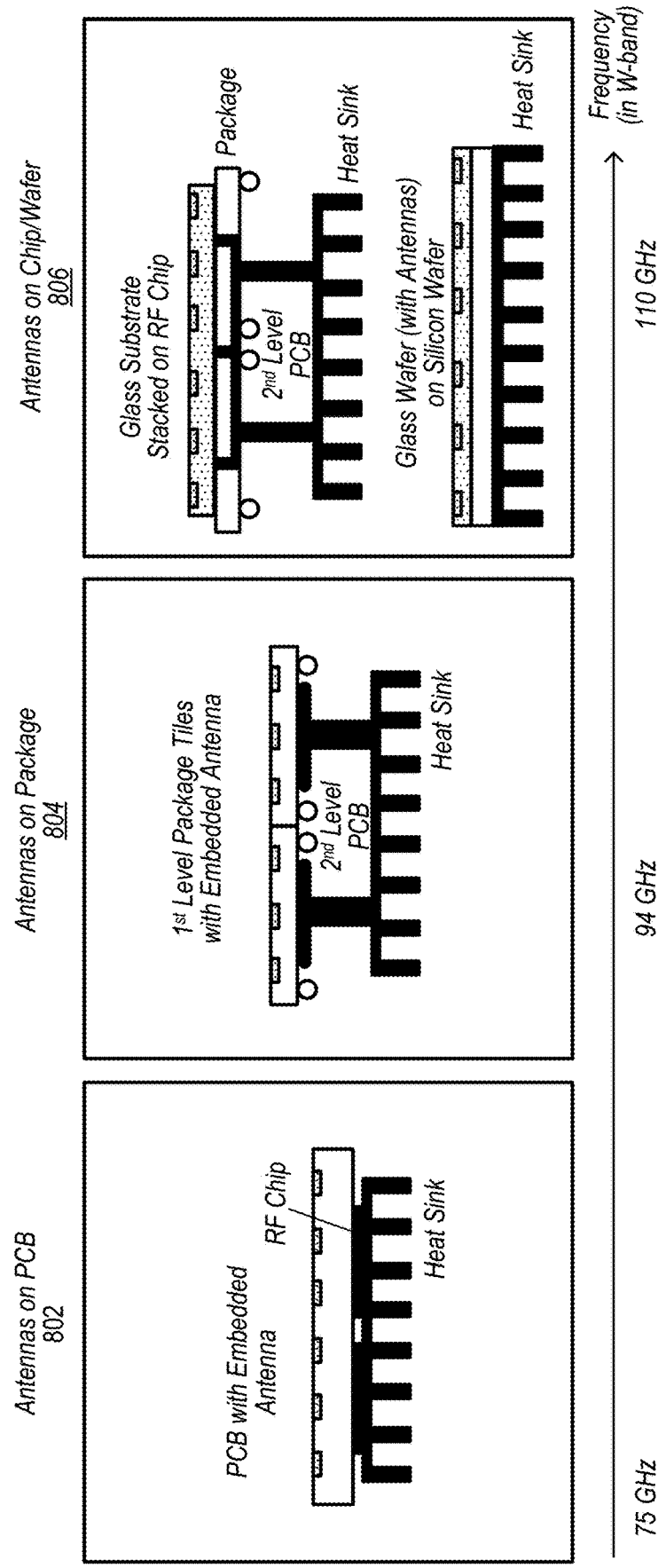

FIG. 8 illustrates different types of antenna connections of exemplary ICs. In a first configuration (802), antennas may be embedded in a printed circuit board (PCB), to which RF chips and a heat sink are mounted. Such a configuration may be useful for relatively low frequencies, e.g., approximately 75 GHz, according to some embodiments. In a second configuration (804), antenna patches may be embedded in package tiles, which are in turn mounted to RF chips and a (e.g., $2^{nd}$ level) PCB. The RF chips may be connected (thru the PCB) to a heat sink. Such a configuration may be useful for medium frequencies, e.g. 94 GHz, among various possibilities. A third configuration (806) may include antenna patches embedded in a glass substrate and stacked on RF chips, e.g., above a package, $2^{nd}$ level PCB, and heat sink. In a variation, the glass wafer may be mounted on a silicon wafer instead of a package. Such configurations may be useful for higher frequencies, e.g., 110 GHz and above, among various possibilities.

Figure 9:
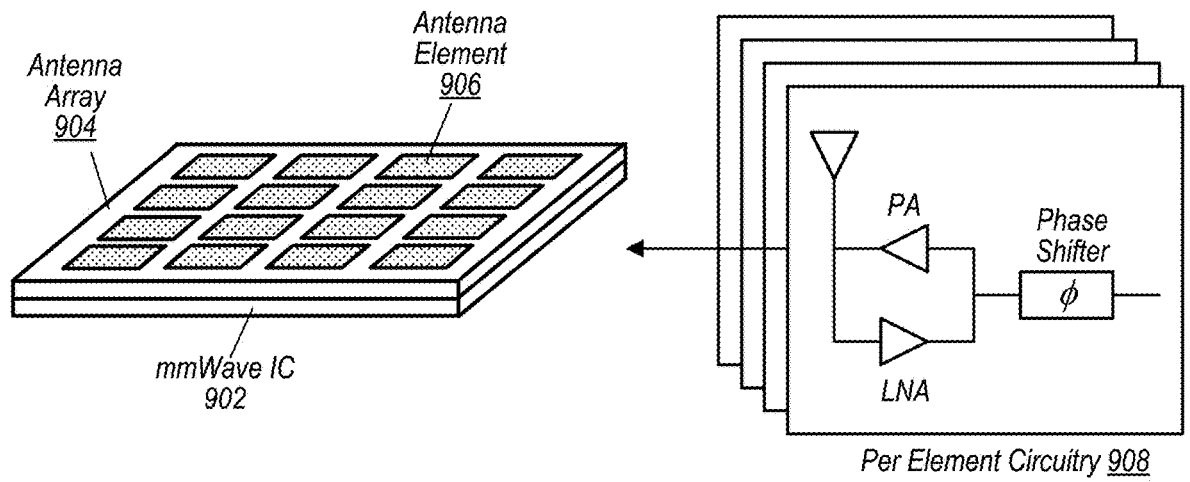

FIG. 9 illustrates an exemplary mmW IC (902) with an integrated antenna array (904). As shown, each antenna element (e.g., patch) (906) may have dedicated (e.g., per element) circuitry (908). Note that the specific antenna element circuitry shown is exemplary only, and that other circuit configurations may be used.

FIGS. 10-16—Testing of mmW IC RF Performance

As demand for ICs with integrated antenna arrays grows, improvements in the cost of producing and testing such ICs are desired. Testing of mmW ICs, e.g., according to conventional techniques, may be challenging for various reasons. There may be no physical (e.g., wired) connections such as coax, waveguide or pins with which to connect the antennas to test equipment. However, power and control connections may be made using conventional, e.g., wired methods. Therefore, the radio frequency (RF) performance (e.g., mmW transmission and reception) must be tested over-the-air. Anechoic chambers may be a common technique to avoid interference, e.g., due to reflected signals and multipath effects that can complicate test measurements. However, in order to avoid RF coupling (e.g., interference of the testing equipment with the performance of the antenna array), the testing equipment may require significant space. Further, beamforming requirements may lead to many antennas on a package or on a chip and it may be desired to test the beamforming directional capabilities of the antenna array/IC. Testing of the beamforming capabilities may be expensive, time-consuming, or difficult, e.g., to take measurements from a potentially large number of positions, e.g., because the RF performance may vary spatially. In other words, in order to test the spatial RF performance, measurements must be taken in many positions (e.g., in 3 dimensions, e.g., as a function of x, y, and z position). Such detailed spatial testing may require complex calibration. Still further, a relatively large distance (e.g., away from the antenna array) may be needed to measure a fully formed beam, and small anechoic chambers may not allow measurement in the far field of the array (e.g., where the beam may be fully formed).

Figure 10:
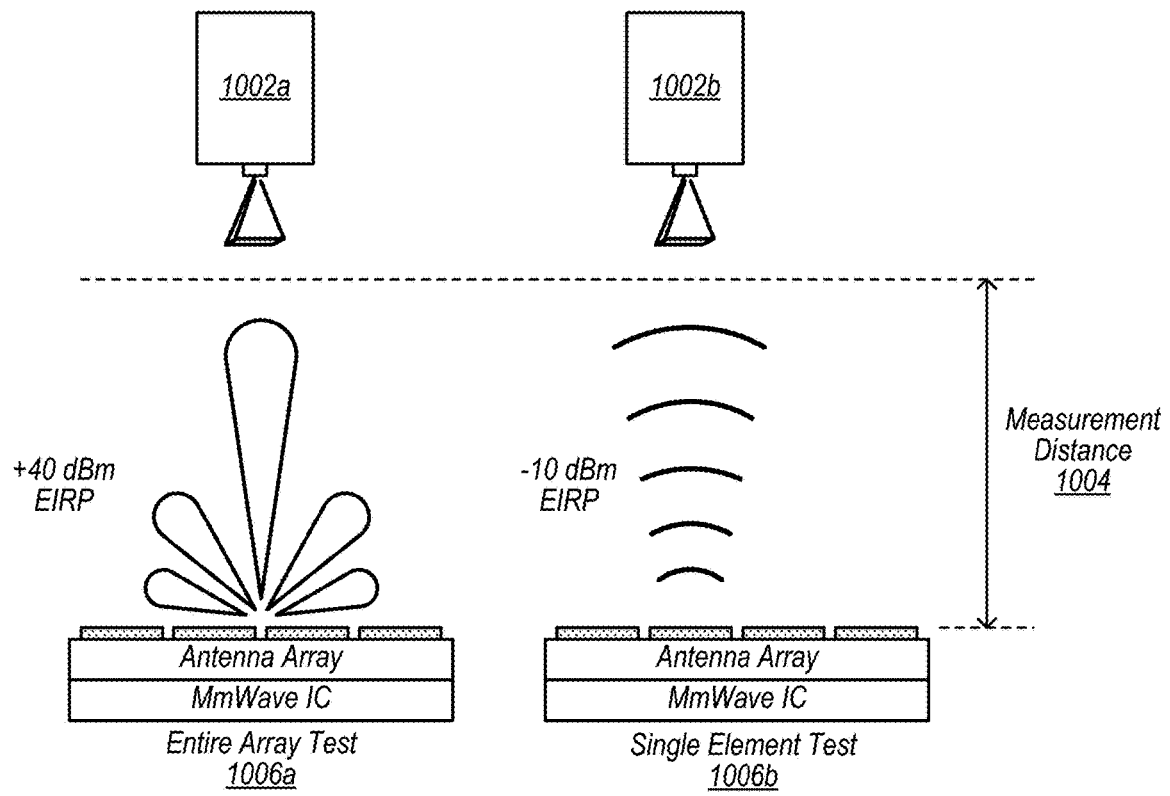
FIGS. 10-16 illustrate aspect of testing millimeter wave integrated circuit radio frequency performance, according to some embodiments.

FIG. 10 illustrates certain aspects of over-the-air testing of RF performance, according to some embodiments. An entire array may be tested, e.g., using an antenna (1002a and 1002b), e.g., a horn antenna as illustrated or other type of antenna (e.g., patch, dipole, loop, directional array, etc.). In order to test the beamforming capability of the array, the antenna (or antennas) may be positioned at a sufficiently large measurement distance (1004) that the beam is fully formed. Further, measurements may be taken from a variety of different positions in order to test the performance of the beam in different directions. An entire array test (1006a) may involve relatively high power signals, e.g., +40 dB (e.g., Equivalent Isotropically Radiated Power (EIRP)), as shown, among various possibilities. The array of antennas may have a power gain (e.g., array gain) relative to a single antenna. Alternatively, single element tests (1006b) may be performed. A test may require that the horn antenna be far enough away from the antenna element(s) to be tested to avoid RF coupling. This distance may be smaller for a single element test than the distance for beam formation, e.g., for an entire array test. A single element test may not test the beamforming performance of the array. Single element tests may involve relatively low power signals, e.g., −10 dB, as shown, among various possibilities.

Figure 11:
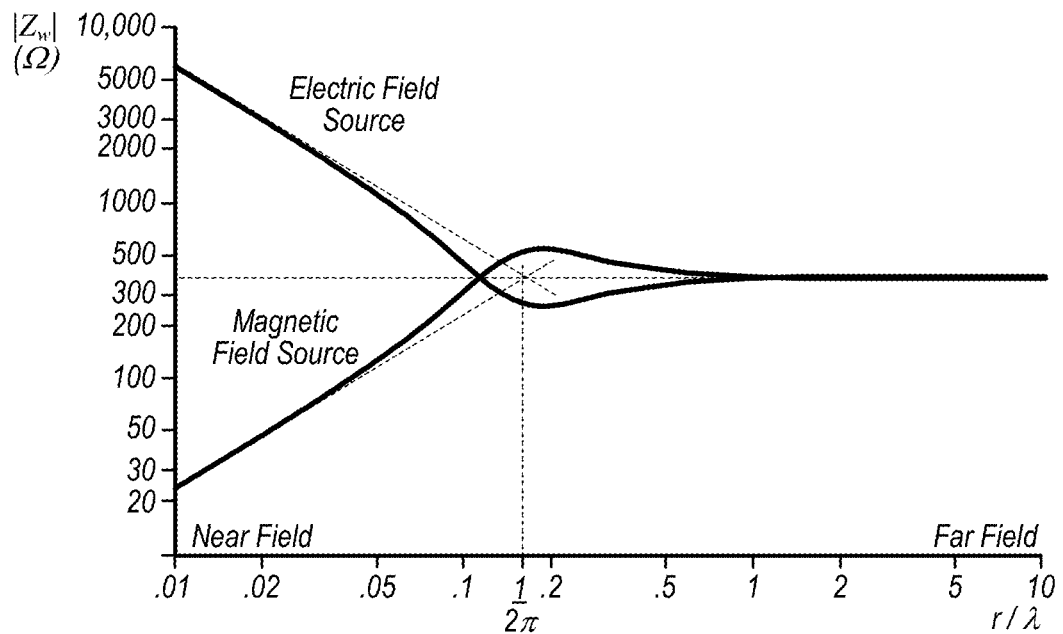

FIG. 11 illustrates fields generated by a short dipole antenna, specifically the wave impedance as a function of distance from the antenna. A "short" dipole may be one where its length is (e.g., much) shorter than ½ wavelength. For the far field, where the distance is greater than the wavelength, the following relations may hold:

E/H=377, for r/λ>1, where E is electric field, H is magnetic field, r is radius, and λ is wavelength;

E and H reduce as 1/r; and

Power drops as $1/r^2$.

For the near field, either the magnetic field or the electric field may dominate. A conductor placed in the near field reactive region may couple electrically or magnetically (e.g., Reactive coupling) and load down the source driving the antenna. For example, test equipment placed in the near field region may interfere with the operation of the antenna, due to reactive coupling.

Figure 12:
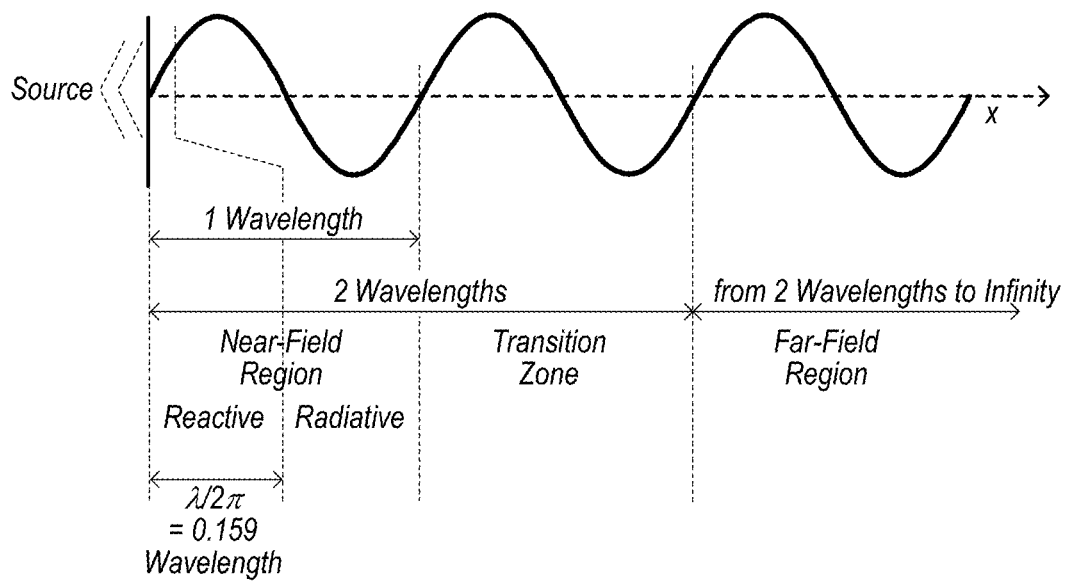

FIG. 12 illustrates fields generated by a short dipole antenna, with further detail of different regions, e.g., as a function of distance from the antenna. In the near-field radiative and transition regions, E and H may reduce as $1/r^n$, where n varies from 1 to 6.

Figure 13:
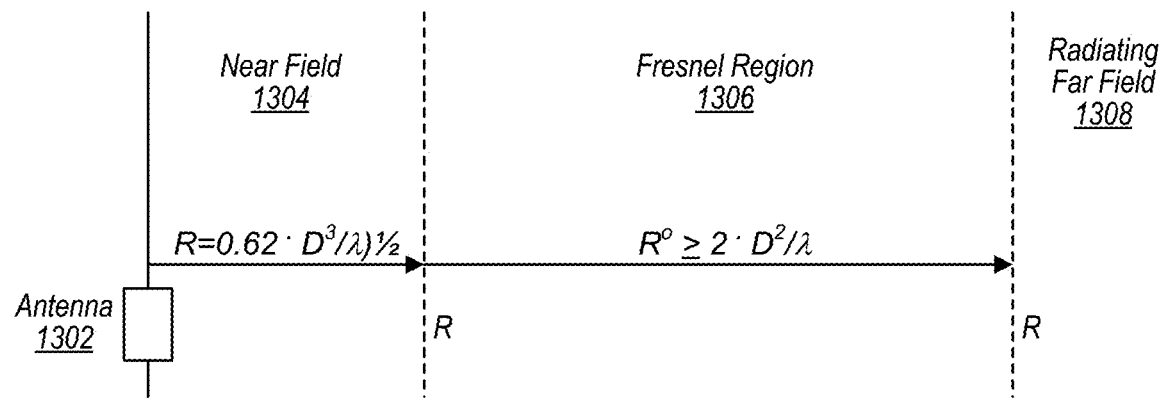

FIG. 13 illustrates radiation zones for antennas larger than half a wavelength, e.g., in contrast to a short dipole antenna. In some embodiments, the length of an individual antenna patch (1302), e.g., as incorporated in an mmW IC, may be approximately equal to half a wavelength. However, an array of such antennas may be (e.g., much) larger than half a wavelength. Therefore, such an antenna array may exhibit characteristics similar to a single antenna larger than half a wavelength, e.g., as illustrated. The near field (e.g., reactive) region (1304) may be defined as:

$$r \leq 0.62\sqrt{\frac{D^3}{\lambda}},$$

where D is the length of the antenna. Conductors in this region may load down the antenna and significantly change the radiation pattern.

The Fresnel (or transition) region (1306) may be defined as:

$$0.62\sqrt{\frac{D^3}{\lambda}} < r \leq 2\frac{D^2}{\lambda}$$

The radiation pattern may not be fully formed in this region. Conductors in this region may not significantly change the radiation pattern.

The radiating far field region may be defined as:

$$r > 2\frac{D^2}{\lambda}$$

The radiation pattern (1308) may be fully formed in this region.

Figure 14:
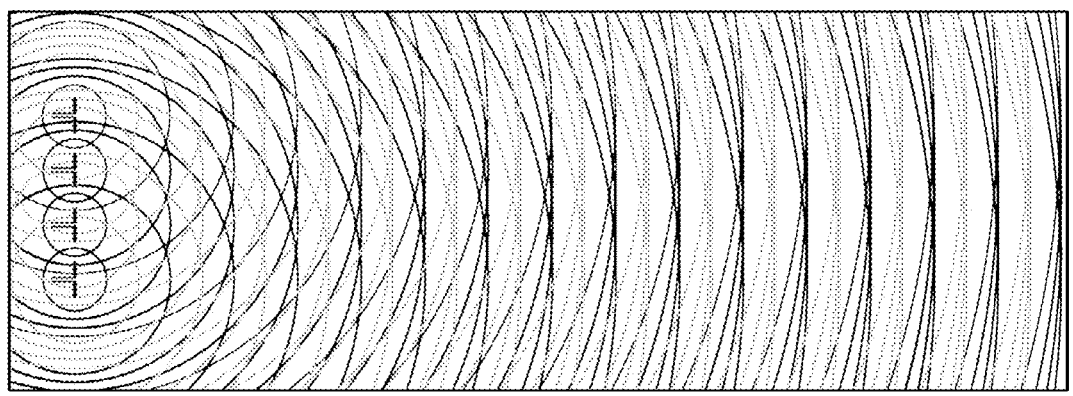

FIG. 14 illustrates the radiation pattern of an exemplary array of 4 antenna elements. Note that the radiation pattern is not fully formed close to the antennas, and becomes clearer (e.g., more fully formed) at increasing distance.

Figure 15:
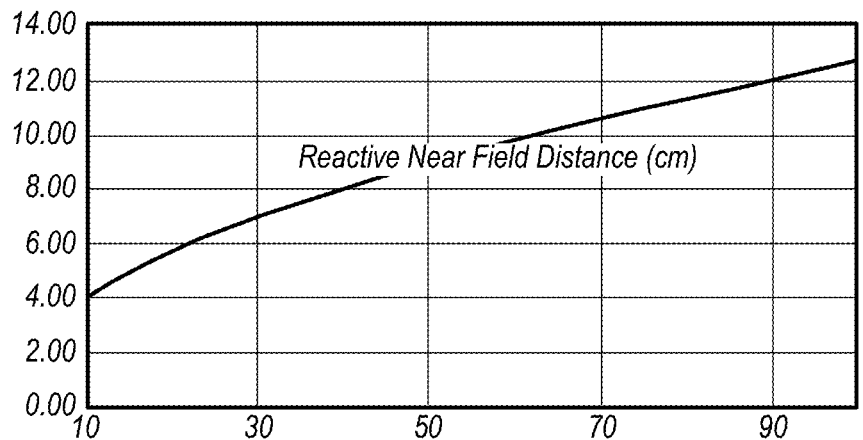
Figure 16:
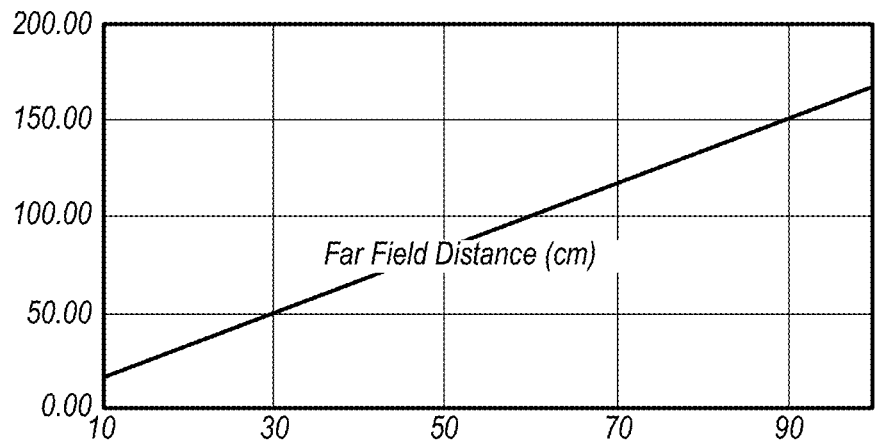

FIGS. 15 and 16 illustrate the boundary of a near field and far field regions (e.g., respectively) for a 5 cm (e.g., square) antenna array as a function of frequency (in GHz). Receiving antennas (e.g., such as testing equipment) may significantly affect the pattern when placed in the reactive near field, e.g., due to RF coupling, e.g., reactive (capacitive or magnetic) coupling. Receiving antennas may not significantly affect the pattern when placed in far field, e.g., because power in the far field is radiated into space. The pattern may not be fully formed in between the near field boundary and the far field boundary (e.g., in the transition zone or Fresnel region, e.g., at distances greater than the near field boundary of FIG. 15 but less than the far field boundary of FIG. 16), but it may not be significantly affected by a receiving antenna. The transition zone may be the far field for each element. However, the (e.g., combined) beam may not be fully formed in this range, e.g., the beam pattern may be different from near field or far field beam patterns.

For example, consider a 30 GHz transmission, e.g., which may be common in a 5G communication system. As shown in FIG. 15, the near field region may end at approximately 7 cm away from the antenna array. The far field region may begin at approximately 50 cm away from the antenna array. Therefore, for the exemplary case of a 30 GHz transmission associated with a 5 cm array, the transition zone may be the zone between 7 and 50 cm from the antenna array. It is noted that other array sizes and frequencies are possible, that the techniques and systems disclosed herein may be applied to other sizes and frequencies as desired, and that the zone boundaries may vary, e.g., based on size and frequency.

Over-the-Air (OTA) Production Testing

An alignment fixture, e.g., as described herein, may be used for production testing of phase array antennas. An alignment fixture may integrate a (e.g., off the shelf) System Level Test handler with an (e.g., off the shelf) anechoic mini chamber and instruments to test the phase array antennas. The alignment fixture may include interfaces between the chamber and the handler.

The alignment fixture may provide any combination of the following features (and/or other features), according to some embodiments.

Alignment. The device under test (DUT) (e.g., a phase antenna array such as a mmW IC) may be extremely small and the tolerances (e.g., for position of the DUT) may be small (e.g., less 100 microns), according to some embodiments. The alignment fixture may serve to align the DUT(s) to the chamber, e.g., in a desired testing position. The alignment may be so that radio frequency (RF) probes can correctly touch the DUT. The RF probes may be small probes that may be part of the socket. The RF probes may touch the electrical connections of the DUT and may make the connection to the loadboard. For example, electrical signals (e.g., input and/or output signals) to and/or from the DUT may may transmitted using the RF probes during testing.

Isolation. Electromagnetic isolation (EMI) of the DUT into the chamber during testing may be important to ensuring valid test results.

Rigidity. The design may last many (e.g., multiple million) cycles without repair.

Adapt to multiple DUT specifics. The alignment fixture may be configurable/adjustable to accommodate different DUTs. The DUTs may be phase array antennas also called Antenna Under Test (AUT).

DUT Detection. To make sure the DUT is in place correctly before the handler engages, a mechanism may be used to produce a "correct placement" signal. For example, the alignment fixture may include a mechanism for detecting whether a DUT is placed correctly. Such a mechanism could rely on any combination of mechanical, electrical, magnetic, and/or optical sensors.

Figure 17:
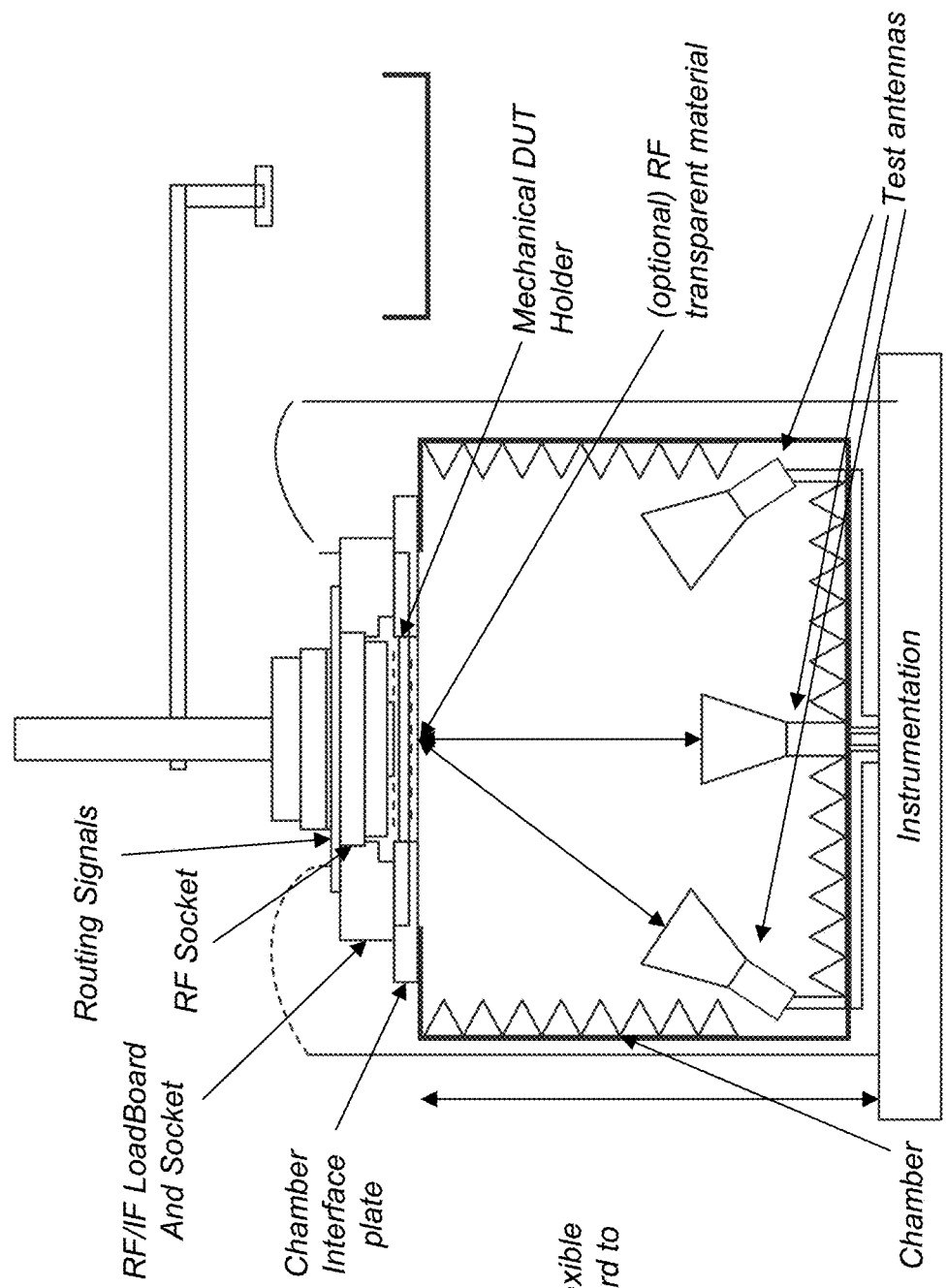
FIGS. 17-24 illustrate various aspects of methods and systems for over-the-air testing of phased array antennas, according to some embodiments.

FIG. 17 illustrates a high level view of a test system including the alignment fixture, according to some embodiments. It will be appreciated that FIG. 17 is not to scale and that the illustrated elements, relationships, dimensions, and measurements are only examples. Additional or different elements may be included and/or some illustrated elements may be omitted, according to some embodiments. Further, elements may be arranged differently than shown, according to some embodiments. In some embodiments, the test antennas may be positioned at a far field distance relative to the DUT (and vice versa). In some embodiments, the test antennas may be positioned in a transition zone or Fresnel region.

As shown, the test system may include an anechoic chamber with a number of test antennas located in different regions of the chamber. The test antennas may be connected to various instruments. The test system may also include a handler, e.g., configured to approximately position one or more DUT in a testing position. The test system may also include an alignment fixture to position the DUT more precisely in the test position, reduce vibration during testing, and isolate the DUT from electromagnetic interference during testing.

The alignment fixture may include an interface to the anechoic chamber. The interface may be a chamber interface plate such as a chamber interface plate, e.g., to guide the DUT(s) into a precise testing position and to retain the DUT in the testing position during testing. a loadboard (e.g., a printed circuit board (PCB) that may connect measurement instruments to the DUT, e.g., via socket/contactor). The loadboard may have loads, filters, and signal conditioning electronics populated on it. The alignment fixture may include a socket (e.g., or sockets) for attaching the DUT(s). The socket may include separate (or separable) top and bottom portions. The top and bottom socket portions may work together to position the DUT for probing/contact to make electrical connections to the test resources/instruments. In other words, the loadboard and the socket may exchange test information with the DUT during testing. For example, the loadboard and socket may use probe contacts with the DUT to provide test signals for the DUT to transmit to test antennas in the anechoic chamber. Similarly, the loadboard and socket may use probe contacts with the DUT to receive output from the DUT based on signals received by the DUT (e.g., transmitted from test antennas in the anechoic chamber).

The loadboard and/or socket(s) may include one or more conductive pad (e.g., made of and/or plated with copper, gold (e.g., hard gold plated), steel, and/or other electrically conductive material). The conductive pad(s) may be electrically coupled with a ground plane(s) (e.g., made of and/or plated with copper, gold (e.g., hard gold plated), steel, and/or other electrically conductive material). The ground plane may be a part of the loadboard and/or may be external to the loadboard. For example, a PCB may include a ground plane. For example, the conductive pad may be (e.g., or may be mated to) a copper (e.g., or other conductive) surface of the loadboard. The conductive pad may be configured to electrically connect with a gasket interface of the anechoic chamber, e.g., when the alignment fixture and the DUT(s) are in the testing position. Thus, the combination of the conductive pad(s), ground plane(s), and gaskets may isolate the DUT(s) from electromagnetic interference (EMI) when the DUT(s) are in the testing position. The ground plane may thus serve the purpose of a "door" to be closed to provide EMI isolation. The process of inserting a DUT and providing EMI isolation for the DUT may be repeated for many cycles, e.g., many DUTs in automated fashion. Reusing the ground plane of the loadboard to provide EMI isolation may reduce cost and complexity.

In some embodiments, the alignment fixture may include an attachment for the DUT(s). The attachment may accept the DUT(s) to be inserted from the top down. The DUT(s) may be positioned at the top of the chamber and the test antennas may be positioned at the bottom of the chamber. Thus, for Tx testing, the DUT may radiate signals down to the test antennas. With the inserted DUT (e.g., antenna array) facing down, the loadboard may be above the DUT. This arrangement may facilitate easier integration with a (e.g., typical) handler, e.g., with no modifications (or minimal modifications) to their standard mechanics which may be to pick up and drop down. Further, the DUT facing down may facilitate easier integration with an (e.g., typical) anechoic chamber, e.g., with test antennas below (e.g., no movement of the RF test antennas may be required). Other arrangements may be used as desired. For example, the DUT may be positioned at the bottom or side of the chamber.

Figure 18:
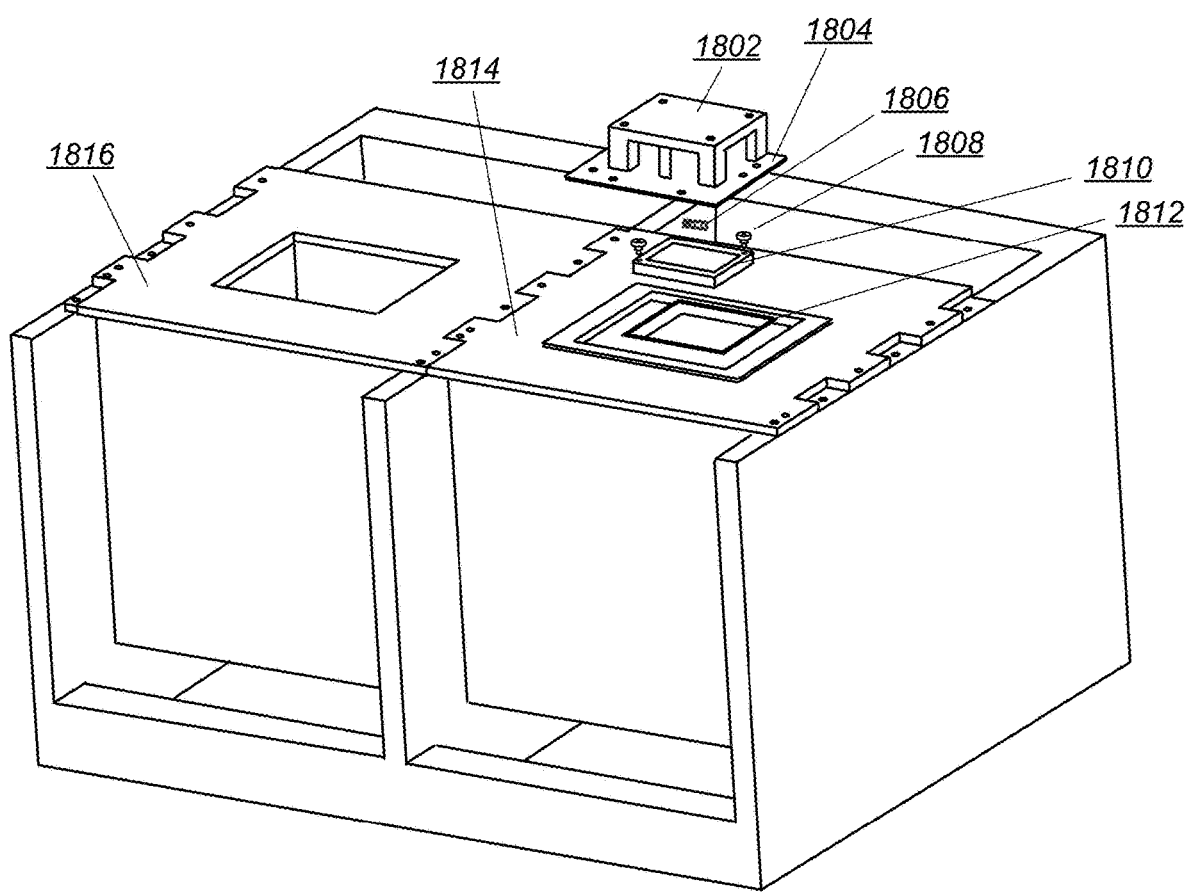

FIG. 18 illustrates a blown-up view of an OTA alignment fixture, according to some embodiments. As shown, the alignment fixture may include a handler bracket 1802, e.g., a plunger. The handler bracket 1802 may attach to a loadboard 1804. A DUT 1806 may be placed between the loadboard 1804 and a chamber interface plate 1810. The chamber interface plate 1810 may be attached using one or more shoulder screws 1808 to chamber interface gasket 1812. The alignment fixture may position the DUT 1806 relative to chamber 1814. It will be appreciated that any number of additional chambers 1816 and corresponding OTA alignment fixtures may also be included in an OTA test system.

The chamber interface plate 1810 may be fixed (e.g., in a single position relative to the anechoic chamber 1814) or floating (e.g., allowing controlled sliding motion relative to the chamber 1814). A floating chamber interface plate may be free to move within a particular range (e.g., limited by alignment slots, positioning pins, tracks, rails, and/or similar mechanisms). A level of friction for such controlled motion may be configured as desired, according to some embodiments. A chamber interface plate may be referred to as a guideplate.

Figure 19:
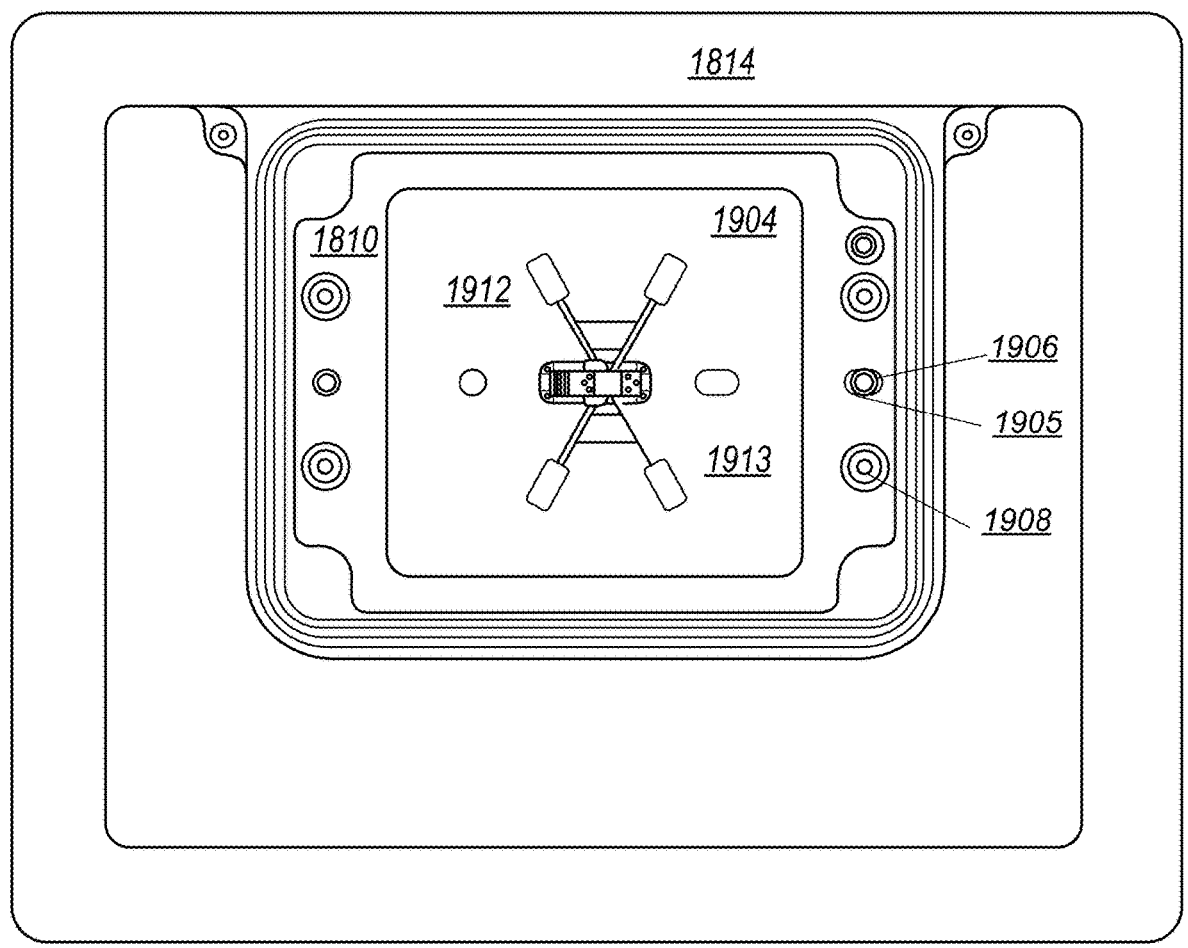

FIG. 19 illustrates a chamber interface plate 1810 and a chamber 1814, according to some embodiments. In some embodiments, the chamber interface plate 1810 may include a socket 1904. The socket 1904 may have very stringent alignment tolerances. In some embodiments, the socket 1904 may include two portions, e.g., a top portion and a bottom portion. The top portion of the socket may attach to a loadboard (not shown in FIG. 19). Thus, alignment of the socket 1904 relative to the chamber 1814 may require some coordination and/or adjustment of the chamber interface plate 1810. The chamber 1814 may include one or more positioning pins 1905 and the chamber interface plate 1810 may include one or more alignment slots 1906, e.g., so that each alignment slot corresponds to a positioning pin. Further, the chamber interface plate 1810 may be made of (e.g., and/or coated with) low-friction material so that it can shift a small amount to the desired location, e.g., to position the DUT in the testing position. Similarly, the loadboard may have guide pins that determine the (e.g., approximate) position of the chamber interface plate (e.g., using additional alignment slots 1906). This way, when the handler (e.g., a plunger) brings a DUT into the approximate testing position, the chamber interface plate may move to the right location. This movement may be controlled by a (e.g., customized) level of friction.

In some embodiments, the chamber interface plate may be secured in place (e.g., using the screw and spring assembly 1908) to avoid any vibration which may cause the chamber interface plate to move out of place. The chamber interface plate force for alignment may be balanced with the handler grip force on the DUT. If the chamber interface plate moves too easily it may move due to vibration, e.g., of moving arms of the handler. If the chamber interface plate is too restrained, the handler grip force on the DUT may be incapable of holding the DUT all the way into the socket position. Thus, the force for alignment of the chamber interface plate may be controlled by springs and screws 1908. The design may allow for customized spring force to be added so that a desired level of sliding friction between the chamber interface plate 1810 and the chamber 1814 may be achieved. The friction (e.g., spring applied and/or due to weight of the chamber interface plate 1810 and/or other components) may allow the chamber interface plate to move and align with the loadboard. When the DUT is placed, the friction may restrict motion of the chamber interface plate such that the DUT will glide into place either through gravity or through sliding movement of the plunger holding the DUT as the DUT descends into the socket. For example, the screws of the screw and spring assembly 1908 may be tightened to increase the spring force (and thus increase the level of sliding friction) to hold the chamber interface plate in place more securely. Alternatively, the screws may be loosened to decrease the spring force (and thus friction) to allow the chamber interface plate to move more with the handler, e.g., so that the handler may retain the DUT fully in the socket. Further the spring k-value (e.g., stiffness of the spring) may be customized to apply the proper friction force.

In some embodiments, a handler may rigidly hold the loadboard. The chamber interface plate may allow a handler locating pin (e.g., or pins, which may be located on the loadboard) to determine its precise position (e.g., within 50 um, among various possibilities). When the DUT is placed in the chamber interface plate, the loadboard socket probe pins (e.g., RF probes) may precisely locate to the DUT contact locations.

It will be appreciated that the spring(s) may be an optional feature used to reduce or increase friction, if desired. In some embodiments, the mass of the chamber interface plate may be massive enough relative to the DUT mass that a spring may not be necessary. In some embodiments, other sources of force (e.g., instead of or in addition to) spring force may be used to control the level of friction. For example, weights, magnets, clips, or different types of materials may be used.

The chamber interface plate 1810 may change (e.g., may be exchanged) based on characteristics of the DUT(s) to be tested. For example, if there are bigger DUTs to be tested, a different chamber interface plate 1810 may be used. For a relatively small DUT like the one shown, a relatively large chamber interface plate 1810 may be used and the chamber interface plate may be relatively small, e.g., because the material of the chamber interface plate is more expensive and fragile.

One or more detection mechanisms, e.g., illustrated as a pair (1912 and 1913) may be used to detect the DUT placement, according to some embodiments.

Figure 20:
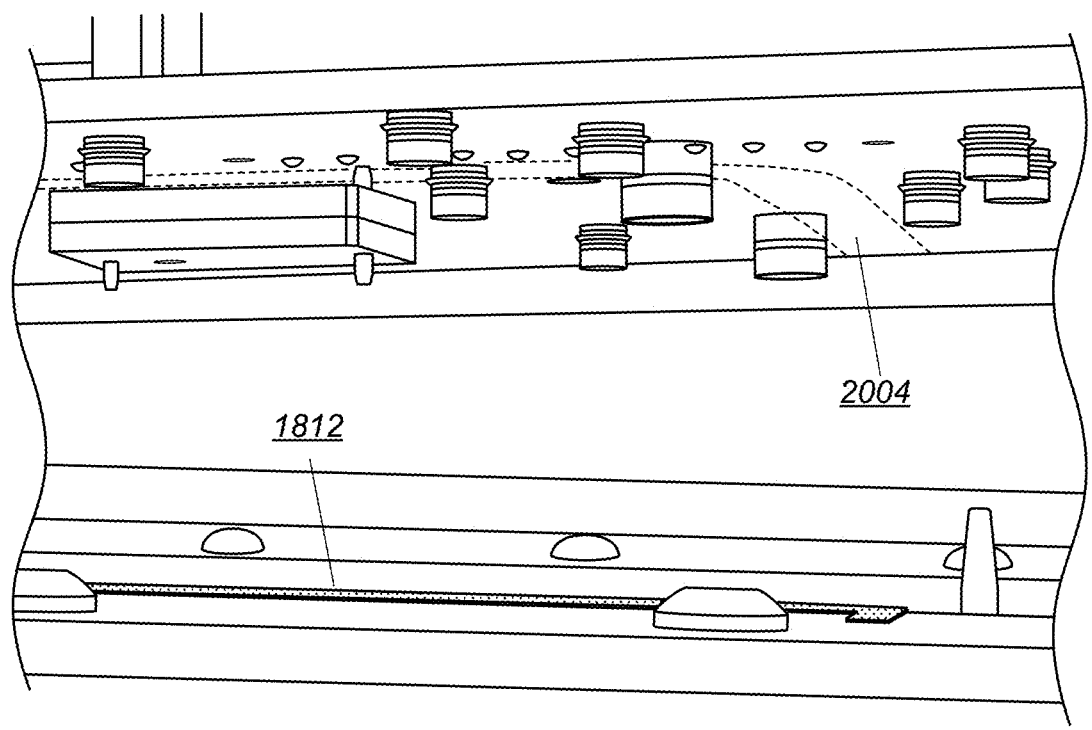

FIG. 20 illustrates aspects of EMI isolation of a DUT by the alignment fixture in combination with an RF gasket 1812 of the anechoic chamber, according to some embodiments. In some embodiments, multiple DUTs may be tested in parallel in the same system (e.g., simultaneously, in the same or separate anechoic chambers). Thus, EMI isolation may be important to make sure there is no interference from one DUT or tester to the next.

The isolation may be done using the loadboard. The loadboard may include a ground plane to provide the electromagnetic compatibility (EMC), e.g., via EMI isolation. In some embodiments, an EMI seal may be achieved by adding a conductive pad 2004 to the loadboard that connects the ground plane. This conductive pad may make contact with a gasket interface 1812 on the anechoic chamber to provide full EMC, e.g., when the load board is in contact with the chamber interface so that the DUT(s) may be in the testing position.

In some embodiments, the design of the conductive pad 2004, ground plane, and gasket 1812 may last a long time and may be produced out of common materials (e.g., the socket and the chamber interface plate may not be made of any exotic RF shielding materials). In some embodiments, the isolation may be close to −40 dB which may be sufficient for testing at frequencies 24 GHz and above. In some embodiments, the design may also be relatively low cost, e.g., due to reducing the number of shielding interfaces and using PCB technology instead of additional mechanical parts.

Figure 21:
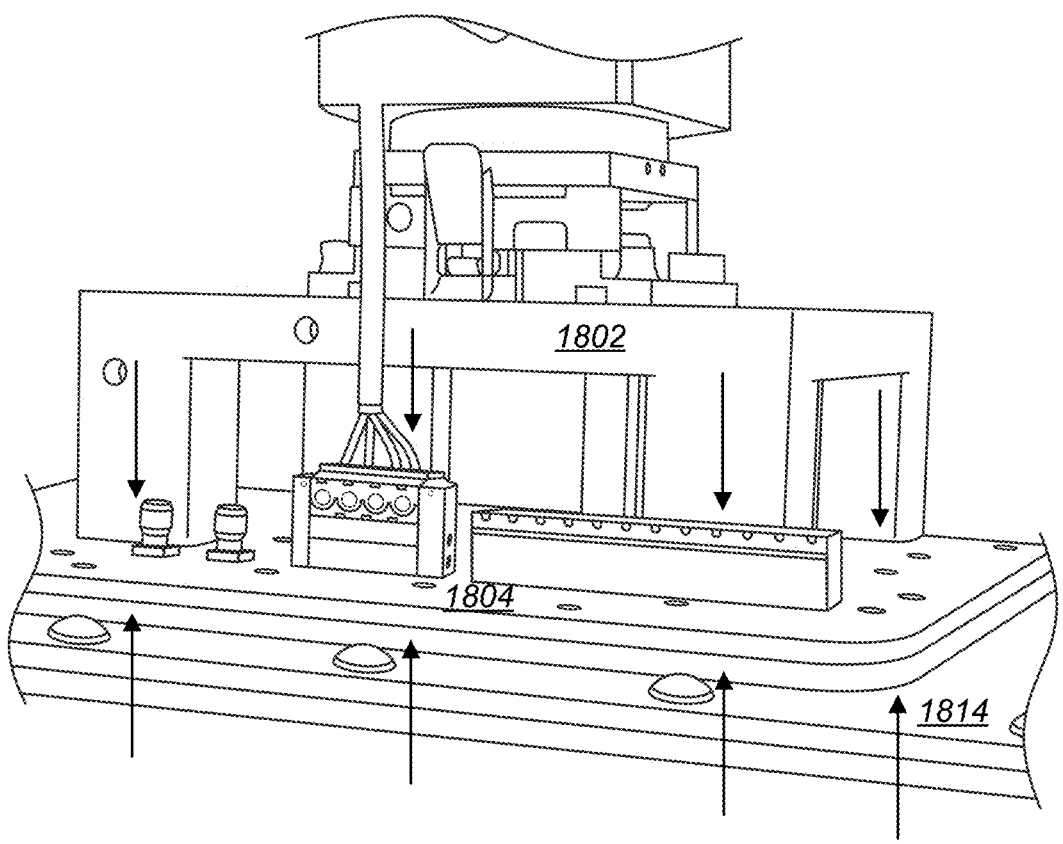

FIG. 21 illustrates a loadboard 1804 being compressed between a handler interface bracket 1802 and an anechoic chamber 1814. In some embodiments, the handler (e.g., plunger) may press with different pressures, e.g., depending on requirements, e.g., different types of DUTs may be tested with different amounts of pressure. For example, the RF gasket contact pressure may be about 15 Kg of force, e.g., to achieve a good seal, e.g., for EMI isolation. To spread the force, a bracket mounted above the loadboard 1804 may transfer the force directly to the chamber 1814 structure, reducing PCB (e.g., loadboard 1804) deflection due to the force of the gasket on the PCB (e.g., loadboard 1804). The design may incorporate a level of rigidity to compress the loadboard 1804 in a planar way and thus avoid or reduce errors over time (e.g., due to bending or uneven wear of the loadboard). In some embodiments, the design may support much more load than is needed.

Figure 22:
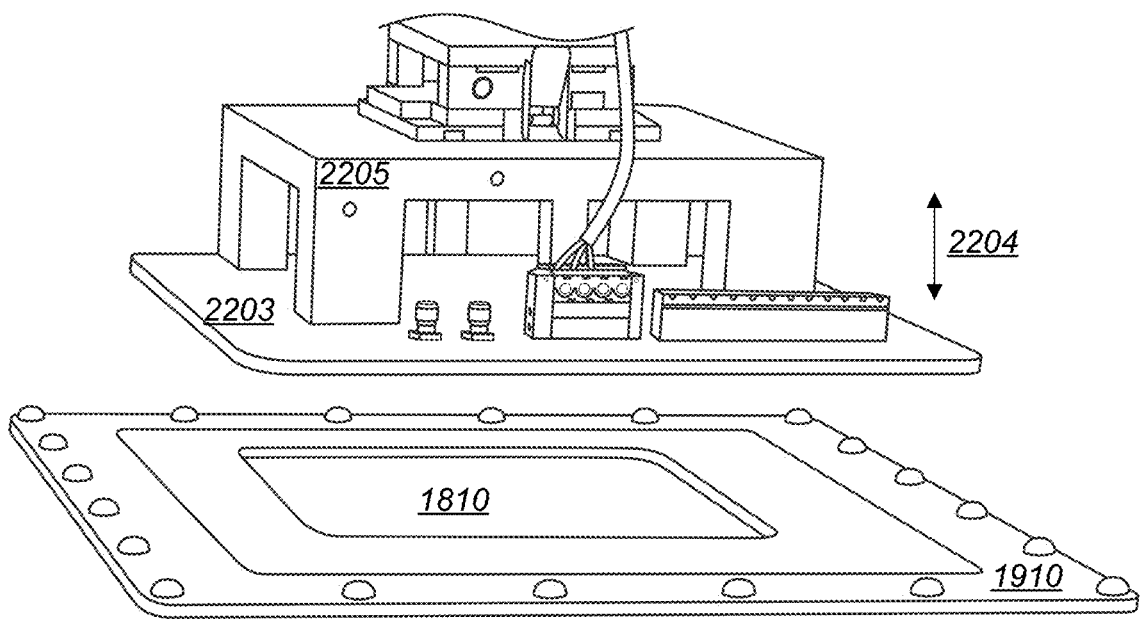

FIG. 22 illustrates how the alignment fixture may be adapted to accommodate different types of DUTs, according to some embodiments. The design of the alignment fixture may be in layers to allow swapping one component individually while the other components remain assembled. This layered design may help adapt certain sections to other DUTs in an efficient way. For example, a larger DUT may use a larger chamber interface plate or a different socket, but it may keep the chamber interface plate 1810 the same. As shown, the loadboard 2203 to handler 2205 interface may also have a clearance 2204 to help populate the loadboard underneath, e.g., allowing more space for components.

Figure 23:
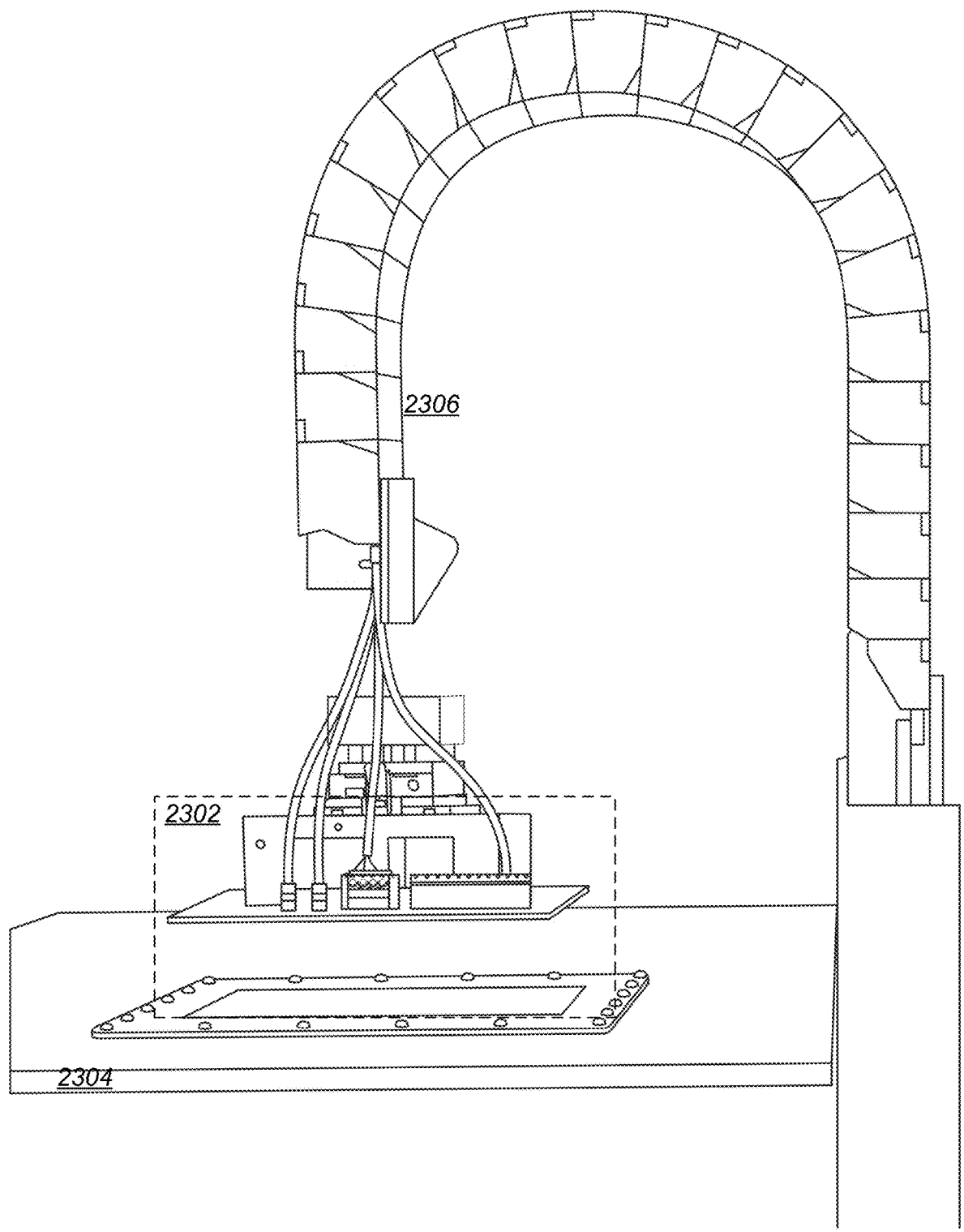

FIG. 23 illustrates an alignment fixture 2302, according to some embodiments. As shown, the alignment fixture (e.g., the components outlined by box 2302 as illustrated) may be an interface between an anechoic chamber 2304 and a handler 2306. The handler may move all or a portion of the alignment fixture to bring one or more DUT to the anechoic chamber. The alignment fixture may connect the DUT(s) to testing equipment (e.g., to provide signals for the DUT(s) to transmit in Tx testing and/or to measure signals received by the DUT(s) in Rx testing). Additionally, the alignment fixture provide EMI isolation and mechanical alignment for the DUT(s) during testing.

Figure 24:
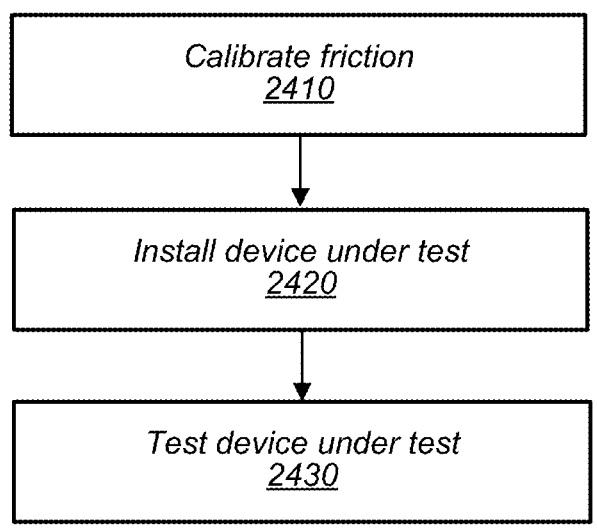

FIG. 24 is a simplified block diagram, illustrating an exemplary method for performing production testing of DUTs such as phase array antennas, e.g., mmW ICs. It is noted that the method of FIG. 24 is merely one example of a possible method, and that features of this disclosure may be implemented in any of various methods, as desired. Aspects of the method of FIG. 24 may be implemented by a system including an alignment fixture (or multiple alignment fixtures), such as illustrated in and described with respect to the Figures, among other systems and devices, as desired. For example, the method of FIG. 24 may be implemented by a systems and devices such as shown in FIGS. 17-23, among various possibilities. In various embodiments, some of the elements of the methods shown may be performed concurrently, in a different order than shown, may be substituted for by other method elements, or may be omitted. Additional method elements may also be performed as desired. As shown, the method may operate as follows.

A level of (e.g., sliding) friction for a particular type of DUT may be determined and the alignment fixture may be calibrated to provide the determined level of friction (2410), according to some embodiments. The level of friction may be determined so that a sliding friction between the chamber interface plate and the loadboard resists vibration and maintains the DUT in a testing position. For example, the level of friction may be high enough so that the chamber interface plate does not slide (e.g., more than a threshold distance) relative to an anechoic chamber and the level of friction may be low enough so that the DUT, when inserted, remains in a socket. For example, if the level of friction is too high, the DUT may be pulled out of the socket and/or damaged by vibration.

In some embodiments, the level of friction may be set, e.g., using one or more springs which may be adjusted using screws or other adjustment mechanisms. In some embodiments, the level of friction may be determined and/or set automatically.

The alignment fixture may install the DUT(s) in a testing position (2420), according to some embodiments. In the testing position, the alignment fixture may provide for EMI isolation of the DUT(s). Further, in the testing position, the alignment fixture may provide the determined level of friction.

The alignment fixture may provide and/or receive signals to/from the DUT(s) for OTA testing (2430), according to some embodiments. The testing may include testing the beamforming capability of the DUT(s) in transmitting and/or receiving signals.

FIGS. 25-30—Example Alignment Fixtures

Figure 25:
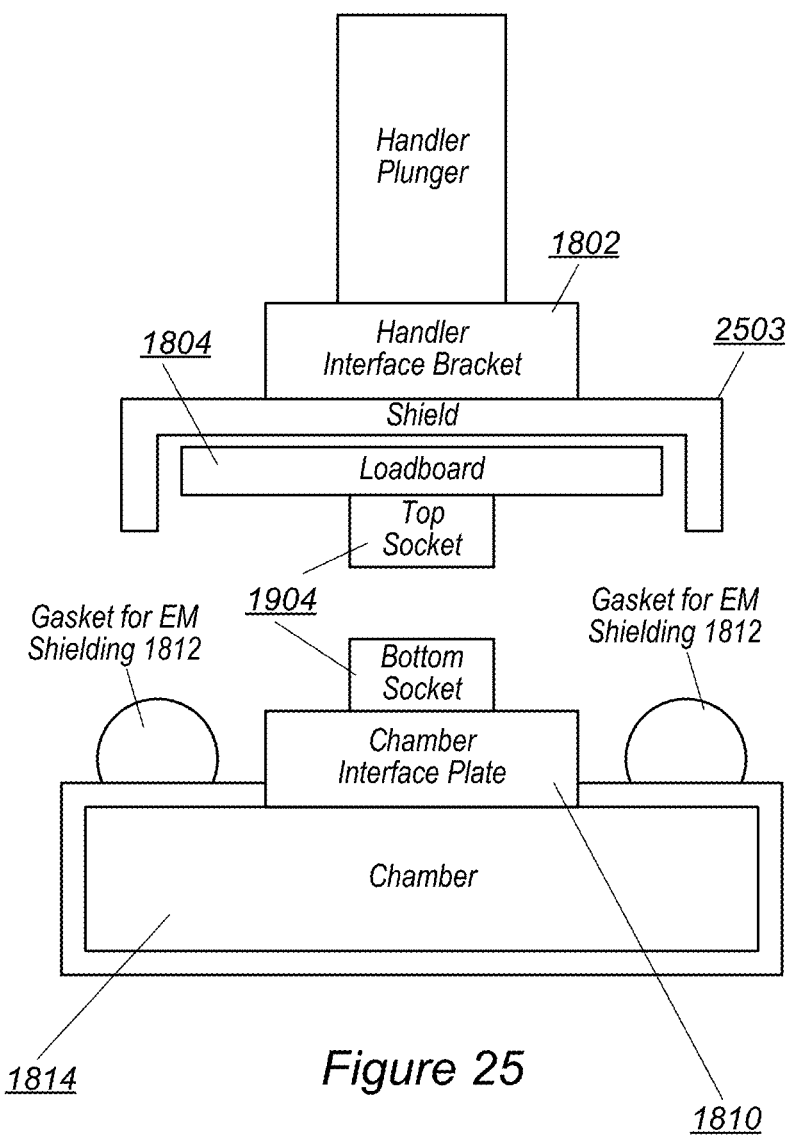
FIGS. 25-30 illustrate various aspects of example systems for over-the-air testing of phased array antennas, according to some embodiments.
Figure 26:
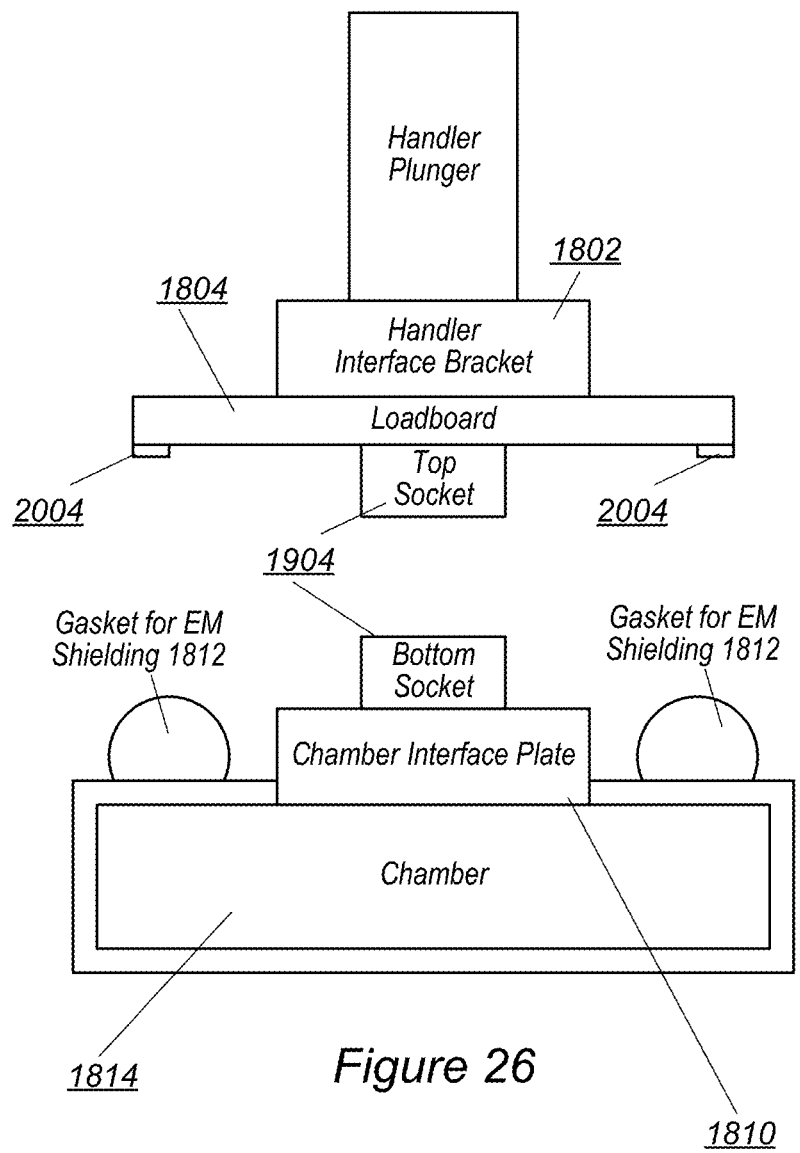
Figure 27:
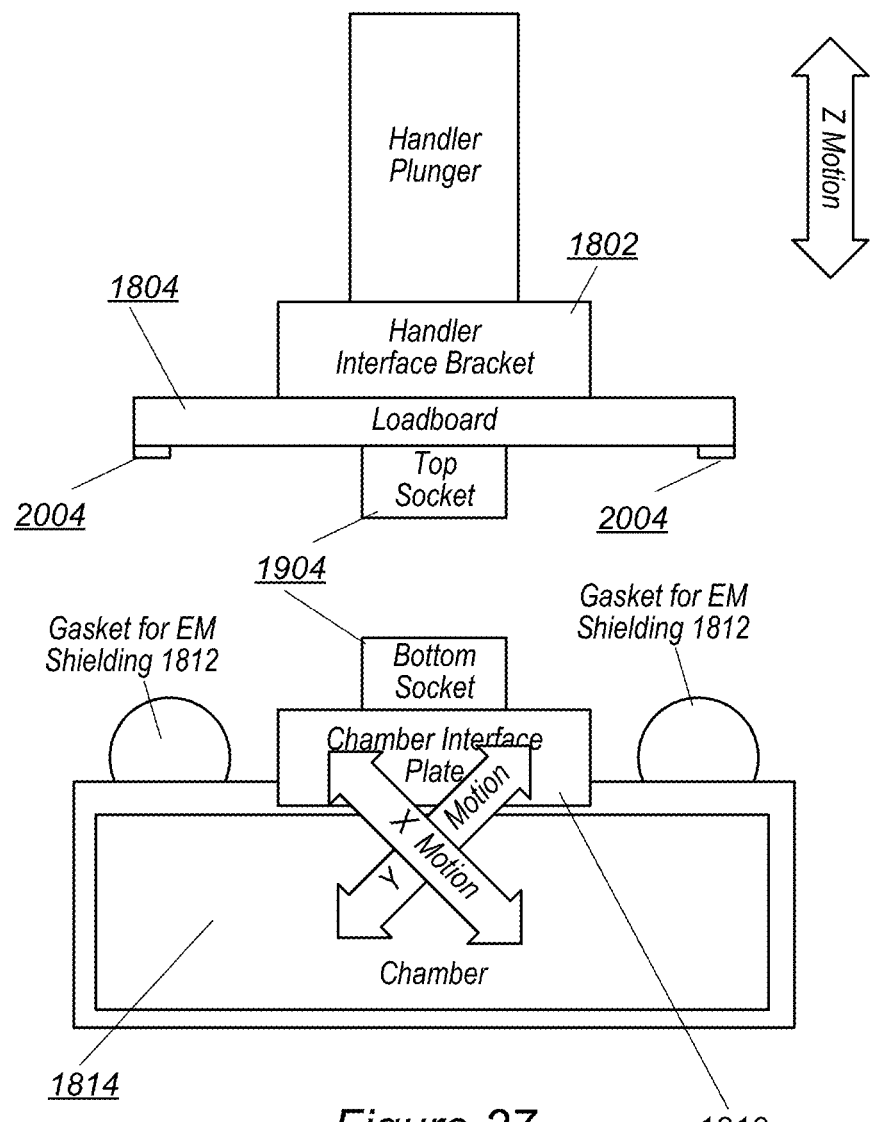
Figure 28:
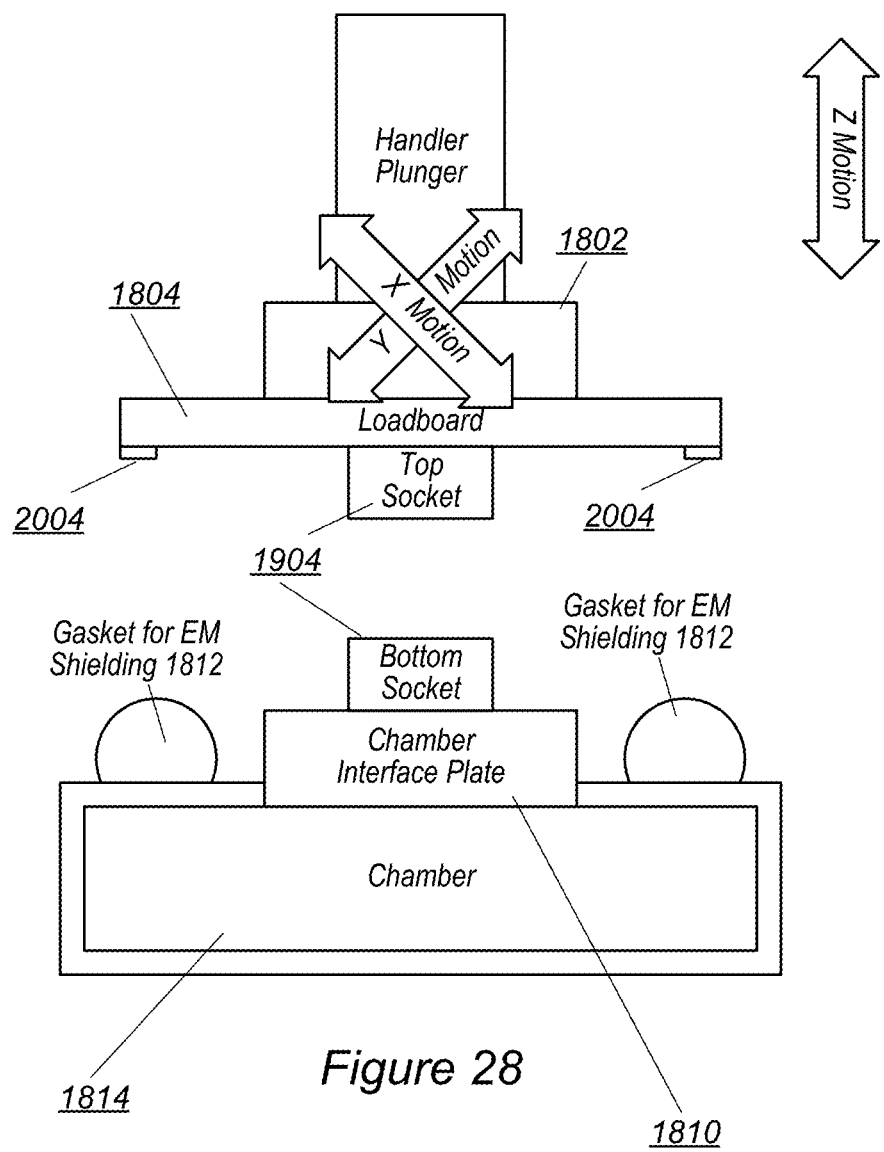
Figure 29:
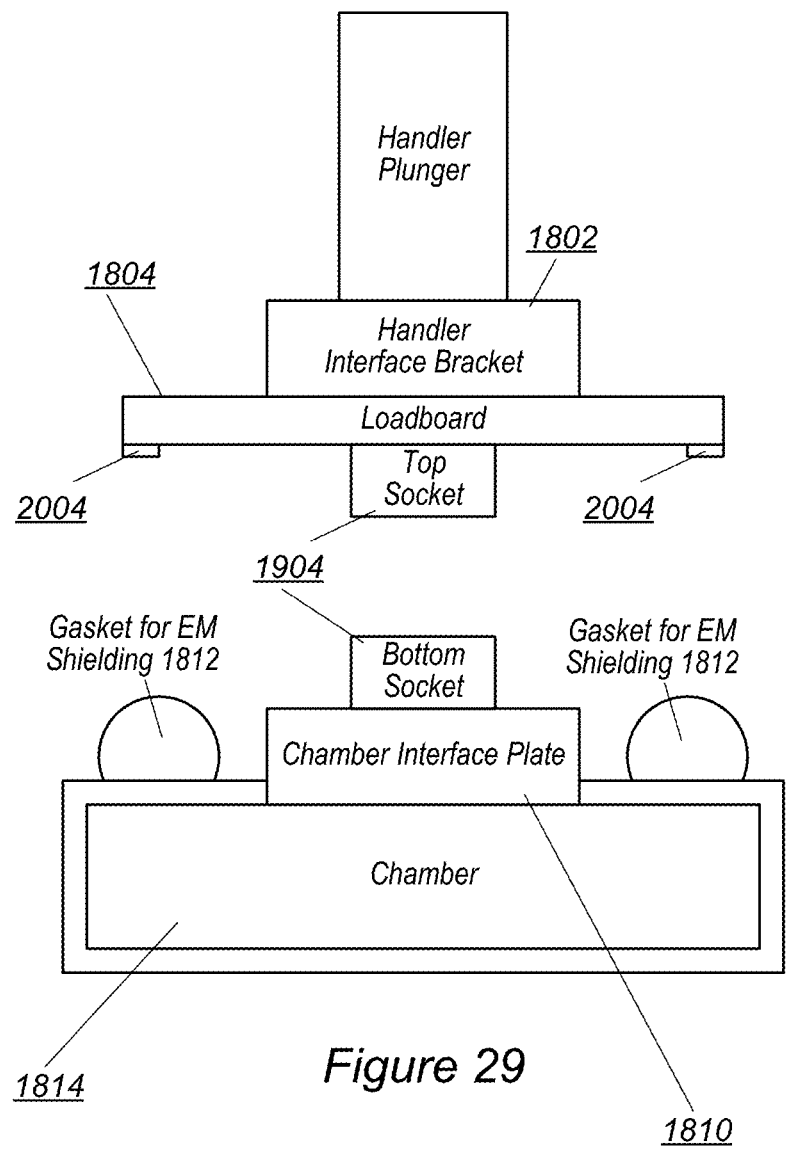
Figure 30:
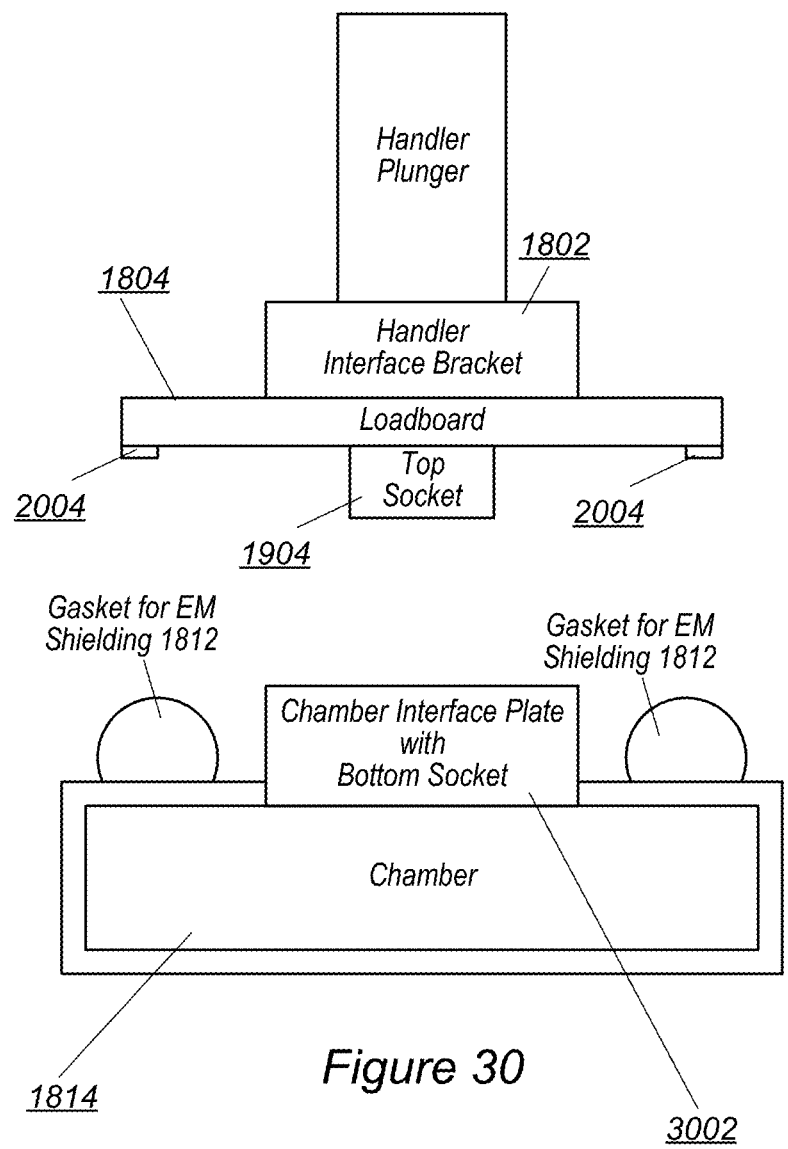

As noted above, an alignment fixture may consist of a number of layers. FIGS. 25-30 illustrate various examples of the layering and modular design of OTA test interfaces using alignment fixtures as described herein. More specifically, FIGS. 25 and 26 illustrate example, alternative means of providing shielding. FIGS. 27 and 28 illustrate example, alternative means of providing alignment. FIGS. 29 and 30 illustrate example, alternative socket locations. It will be appreciated that these alternatives are independent and may be mixed and matched as desired. For example, the shielding approach of FIG. 27 may combined with the alignment approach of either FIG. 27 or 28 and may further be combined with the socket locations of either FIG. 29 or 30, etc. It will be appreciated that FIGS. 25-30 may be expanded views, e.g., in the illustrations, empty space may be shown between one or more layers, but the layers may be in contact, according to some embodiments.

FIG. 25 illustrates an alignment fixture with an electromagnetic (EM) shield separate from a loadboard, according to some embodiments. As shown, a handler plunger may connect to a handler interface bracket 1802. The bracket 1802 may connect to an EM shield 2503. The EM shield 2503 may be distinct from the loadboard 1804. For example, the EM shield 2503 may be a conductive material (e.g., copper or other metal, etc.) and may be configured to contact to a gasket for EM shielding 1812. Thus, the EM shield 2503 and the gasket 1812 may provide EM shielding for a DUT in the testing position. For example, the handler plunger may move down (e.g., in the orientation of the Figure; other orientations may be used as desired), pressing the EM shield 2503 against the gasket 1812. In other words, the conductive shield 2503 may surround (e.g., partly, as shown) the loadboard 1804 and may seal to the anechoic chamber 1814. When in contact, the shield 2503 and gasket 1812 may provide shielding for the DUT so that the DUT may provide for EM isolation and thus EMC of the DUT during testing. Thus, the DUT may be isolated from EM interference from outside of the chamber 1814.

The alignment fixture may further include a socket 1904. As shown, the socket may be divided into two parts/portions, e.g., referred to as a top socket and bottom socket. The bottom socket may be connected to the chamber 1814 via a chamber interface plate 1810.

It will be appreciated that the gasket 1812 and the shield 2503 may each go all the way around the socket 1904. For example, the gasket 1812 and the shield 2503 may create a perimeter around the socket 1904.

FIG. 26 illustrates an alignment fixture providing shielding using a groundplane of the loadboard 1804 and a conductive pad 2004 to provide shielding, e.g., instead of the separate EM shield 2503, according to some embodiments. The conductive pad 2004 may have a continuous connection to the groundplane of the loadboard, e.g., all the way around the loadboard so that the socket 1904 is surrounded. As shown, a conductive pad 2004 may be configured to contact the gasket 1812 and create EM isolation for the DUT when the DUT is in the testing position (e.g., in a similar manner as described above regarding the shield 2503 of FIG. 25). Thus, the groundplate, e.g., in combination with the conductive pad 2004 and the gasket 1812, may be an EM shield for the DUT.

FIG. 27 illustrates an alignment fixture incorporating a chamber interface plate 1810, according to some embodiments. The chamber interface plate 1810 may be a floating plate (e.g., not rigidly attached to the chamber 1814) that may be able to slide in at least one dimension. For example, the chamber interface plate 1810 may be free to move in the horizontal plane (e.g., as indicated in the figure by the Y motion and X motion arrows). Thus, the chamber interface plate may control motion (e.g., of the bottom socket and thus of a DUT in the testing position) in the X and Y dimensions. In some embodiments, the motion of the chamber interface plate 1810 may be perpendicular to the motion of the handler (e.g., to bring a DUT into the testing position, e.g., as indicated in the figure by the Z motion arrow). Moreover, the at least one dimension in which the chamber interface plate is free to move may be in the parallel to the plane of an opening in the anechoic chamber (e.g., which is horizontal, in the illustrated example). Thus, the motion of the chamber interface plate may align the DUT with the opening (e.g., in the center of the opening).

The level of friction between the chamber interface plate and the chamber may be configured as desired, e.g., as discussed above. For example, the weight of the chamber interface plate and the bottom socket may be designed or adjusted to provide a desired level of friction or the level of friction may be controlled by one or more springs, among various possibilities.

FIG. 28 illustrates an alignment fixture with a handler interface bracket 1802 configured to control motion in at least one dimension, according to some embodiments. For example, the handler interface bracket 1802 may include a sliding mechanism to control motion in the horizontal plane (e.g., X and Y dimensions, as shown). The chamber interface plate 1810 may be fixed to the chamber (e.g., may not be floating or sliding). In some embodiments, both a sliding chamber interface plate 1810 and a sliding mechanism in the handler interface bracket 1802 may be used.

FIG. 29 illustrates an alignment fixture with a bottom socket 1904 mounted to a chamber interface plate 1810, according to some embodiments. For example, the bottom socket 1904 may position the DUT (e.g., relative to the chamber interface plate 1810) and may (e.g., in combination with the top socket) provide probe/electrical connections between the DUT and test resources or instruments (e.g., via the loadboard). Note that, in the illustrated example, a fixed chamber interface plate 1810 is shown, but a floating chamber interface plate 1810 may be used as desired.

FIG. 30 illustrates an alignment fixture without a bottom socket and the functions of the bottom socket provided by a chamber interface plate with an integrated bottom socket 3002, according to some embodiments. For example, the chamber interface plate with an integrated bottom socket 3002 may incorporate one or more brackets or other attachment mechanisms for positioning the DUT relative to the chamber interface plate with an integrated bottom socket 3002 and positioning the DUT for probe/electrical connections. The chamber interface plate with an integrated bottom socket 3002 may be fixed or floating.

As noted above, aspects of the FIGS. 25-30 may be used in various combinations as desired. For example, although FIGS. 27-30 show conductive pad 2004 rather than EM shield 2503, other features of FIGS. 27-30 may be used with an EM shield 2503. For example, an EM shield 2503 may be used with a chamber interface plate 1810, etc. Similarly, a chamber interface plate with an integrated bottom socket 3002 may be used with a EM shield 2503. As another example combination, a chamber interface plate 1810 as illustrated in FIG. 27 may be used in combination with a handler interface bracket 1802 including a sliding mechanism as illustrated in FIG. 28. Numerous other combinations and variations are possible.

Additional Information

In some embodiments, the OTA test apparatus may be configured so that the loadboard does not wipe across the gasket when aligning the DUT in the testing position. By avoiding such wiping, premature wear of the loadboard and/or gasket.

In some embodiments, an interface to the anechoic chamber (e.g., chamber interface plate) may be able to provide several features in a cost-effective single part. For example, a plastic interface may have a higher wear interface than the electrically conductive interfaces. The interface may be RF transparent plastic. The plastic material may be able to allow freedom for the chamber interface plate to slide into alignment position, e.g., without using more expensive solution. For example, mechanical solutions, such as mechanical slide rails or bearings may not be used, according to some embodiments.

In some embodiments, the OTA testing may performed in the near field, transition zone, and/or far field regions.

In some embodiments, OTA testing may include measuring transmit and/or receive parameters such as power, frequency, phase, modulation quality, spectrum occupancy, sensitivity, selectivity, image rejection, spurious responses, blocking, etc. using an array of testing antennas. Performance as a function of distance from the DUT may represented by a bathtub curve (e.g., in Tx testing, too close to the DUT, a test antenna may be overloaded; too far from the DUT, the strength of signal from the DUT may be small relative to noise/interference). The bathtub curve may also apply in Rx testing.

In some embodiments, during Tx testing, signals from multiple elements of the array of testing antennas may be combined, e.g., using a beamforming algorithm, and the combined signal may be tested. In some embodiments, individual signals from individual antennas may be tested individually.

In some embodiments, the testing may be performed automatically, e.g., in response to placement of the DUT in the system and connection to the power/control connections.

In some embodiments, multiple DUTs may be tested. For example, multiple DUTs may be installed in testing positions, and may be concurrently or sequentially tested.

In some embodiments, the DUT's wireless capabilities may be tested for phase, power, spectrum, frequency, and/or modulation. Such capabilities may be tested in transmission and/or reception.

In the following, exemplary embodiments are provided.

In one set of embodiments, an over-the-air (OTA) test apparatus, may comprise: a gasket interface; and a loadboard. The loadboard may comprise: an attachment for a device-under-test (DUT); a ground plane; and a conductive pad, wherein the conductive pad is configured to contact the gasket interface and electrically connect the gasket interface with the ground plane when the loadboard is in a testing position, wherein the ground plane, the gasket interface, and the conductive pad provide electromagnetic isolation for the DUT in the testing position.

In some embodiments, the attachment for the DUT may be configured so that a DUT may be inserted from the top down.

In some embodiments, the loadboard may further comprise one or more positioning pin and the attachment for the DUT may comprise: a guideplate comprising one or more alignment slot for positioning the guideplate relative to the loadboard using the one or more positioning pin.

In some embodiments, the OTA test apparatus may further comprise a spring, wherein the spring produces a force on the guideplate so that a sliding friction between the guideplate and the loadboard resists vibration and maintains the DUT in a testing position.

In some embodiments, the guideplate is a low-friction guideplate.

A further exemplary set of embodiments may include a non-transitory computer accessible memory medium comprising program instructions which, when executed at a device, cause the device to implement any or all parts of any of the preceding examples.

A still further exemplary set of embodiments may include a computer program comprising instructions for performing any or all parts of any of the preceding examples.

Yet another exemplary set of embodiments may include an apparatus comprising means for performing any or all of the elements of any of the preceding examples.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. An over-the-air (OTA) test apparatus, comprising:
a gasket interface; and
a loadboard comprising:
   a mechanism for attachment of device-under-test (DUT);
   a ground plane; and
   a conductive pad, wherein the conductive pad is configured to contact the gasket interface and electrically connect the gasket interface with the ground plane when the loadboard is in a testing position, wherein the ground plane, the gasket interface, and the conductive pad provide electromagnetic isolation for the DUT in the testing position.

2. The OTA test apparatus of claim 1, wherein the mechanism for attachment of the DUT is configured so that the DUT may be inserted from the top down.

3. The OTA test apparatus of claim 1, wherein the loadboard further comprises one or more positioning pin and the mechanism for attachment of the DUT comprises:
   a chamber interface plate comprising one or more alignment slot for positioning the chamber interface plate relative to the loadboard using the one or more positioning pin.

4. The OTA test apparatus of claim 3, further comprising a spring, wherein the spring produces a force on the chamber interface plate so that a sliding friction between the chamber interface plate and the loadboard resists vibration and maintains the DUT in a testing position.

5. The OTA test apparatus of claim 3, wherein the chamber interface plate consists of a low-friction material.

6. The OTA test apparatus of claim 3, wherein the chamber interface plate is configured to slide relative to an anechoic chamber.

7. An over-the-air (OTA) test apparatus, comprising:
an electromagnetic shield, configured to provide electromagnetic isolation for a device-under-test (DUT), when the DUT is in a testing position;
a loadboard, configured to exchange test information with the DUT;
a socket, configured to attach the DUT; and
an interface configured to position the DUT in the testing position relative to an anechoic chamber, wherein the OTA test apparatus is configured to allow for controlled motion of the DUT in at least a first dimension when the OTA test apparatus brings the DUT into the testing position via motion in a second dimension.

8. The OTA test apparatus of claim 7, wherein the loadboard is a printed circuit board (PCB).

9. The OTA test apparatus of claim 8, wherein the electromagnetic shield is a groundplane of the PCB.

10. The OTA test apparatus of claim 8, wherein the electromagnetic shield is distinct from the PCB.

11. The OTA test apparatus of claim 7, wherein the interface comprises a chamber interface plate configured to slide in at least the first dimension relative to the anechoic chamber.

12. The OTA test apparatus of claim 8, wherein a bottom portion of the socket is integrated into the interface.

13. The OTA test apparatus of claim 7, further comprising a conductive pad coupled to the electromagnetic shield, wherein the conductive pad is configured to contact a gasket, wherein the electromagnetic isolation is provided by the electromagnetic shield in combination with the conductive pad and the gasket.

14. The OTA test apparatus of claim 7, further comprising a handler interface bracket comprising a sliding mechanism configured to slide in at least the first dimension.

15. The OTA test apparatus of claim 7, wherein the OTA test apparatus is further configured to allow for controlled motion of the DUT in at least a third dimension when the OTA test apparatus brings the DUT into the testing position via the motion in the second dimension.

16. The OTA test apparatus of claim 7, wherein the interface comprises a chamber interface plate mounted in a fixed position relative to the anechoic chamber, wherein the OTA test apparatus further comprises a handler interface bracket configured to slide in at least the first dimension relative to the anechoic chamber.

17. An over-the-air (OTA) test system, comprising:
an anechoic chamber, comprising a radio frequency (RF) gasket;
an interface configured to position a device-under-test (DUT) in a testing position relative to the anechoic chamber, wherein the interface comprises an RF transparent plastic, wherein the interface is configured to slide in at least one dimension relative to the anechoic chamber;
a socket to provide an electrical connection to the DUT; and
a loadboard, comprising a conductive pad connected to a groundplane of the loadboard, wherein the conductive pad is configured to contact the RF gasket when the DUT is in the testing position.

18. The OTA test system of claim 17, wherein the RF gasket, conductive pad, and the groundplane provide electromagnetic compatibility for the DUT in the testing position.

19. The OTA test system of claim 17, wherein the at least one dimension is parallel to an opening of the anechoic chamber.

20. The OTA test system of claim 17, further comprising a handler configured to bring the DUT to the testing position, wherein to bring the DUT to the testing position includes lowering the DUT to the testing position from above.

* * * * *